(12) United States Patent
Shin et al.

(10) Patent No.: US 10,971,537 B2
(45) Date of Patent: Apr. 6, 2021

(54) IMAGE SENSORS

(71) Applicant: Samsung Electronics Co., Ltd., Suwon-si (KR)

(72) Inventors: Seung-hun Shin, Suwon-si (KR); Duk-seo Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/876,925

(22) Filed: May 18, 2020

(65) Prior Publication Data

US 2020/0279886 A1 Sep. 3, 2020

Related U.S. Application Data

(63) Continuation of application No. 16/108,348, filed on Aug. 22, 2018, now Pat. No. 10,672,823.

(30) Foreign Application Priority Data

Nov. 14, 2017 (KR) .......................... 10-2017-0151720

(51) Int. Cl.
*H01L 27/146* (2006.01)
*H01L 27/142* (2014.01)

(52) U.S. Cl.
CPC ...... *H01L 27/14636* (2013.01); *H01L 27/142* (2013.01); *H01L 27/1463* (2013.01); *H01L 27/1464* (2013.01); *H01L 27/14605* (2013.01)

(58) Field of Classification Search
CPC ........... H01L 27/14665; H01L 27/1463; H01L 27/14636
See application file for complete search history.

(56) References Cited

U.S. PATENT DOCUMENTS

| 9,825,081 | B2 | 11/2017 | Oh et al. | |
| 10,672,823 | B2* | 6/2020 | Shin | ...................... H01L 27/142 |
| 2009/0085143 | A1 | 4/2009 | Park | |
| 2013/0221465 | A1* | 8/2013 | Kim | .................... H01L 27/1464 |
| | | | | 257/432 |

(Continued)

FOREIGN PATENT DOCUMENTS

| JP | 2010-267736 A | 11/2010 |
| JP | 6120094 B2 | 4/2017 |

(Continued)

*Primary Examiner* — Dale E Page
*Assistant Examiner* — Wilner Jean Baptiste
(74) *Attorney, Agent, or Firm* — Harness, Dickey & Pierce, P.L.C.

(57) ABSTRACT

An image sensor includes a semiconductor substrate including a pixel region and a pad region, a plurality of photoelectric conversion regions in the pixel region, an interconnect structure on a front surface of the semiconductor substrate, a pad structure in the pad region and on a rear surface of the semiconductor substrate, a through via structure in the pad region and electrically connected to the interconnect structure through the semiconductor substrate, and an isolation structure at least partially extending through the pad region of the semiconductor substrate from the rear surface of the semiconductor substrate. The isolation structure surrounds the pad structure and the through via structure in a plane extending parallel to the rear surface of the semiconductor substrate.

20 Claims, 26 Drawing Sheets

(56) References Cited

U.S. PATENT DOCUMENTS

2013/0323875 A1    12/2013   Park et al.
2015/0008555 A1     1/2015   Mizuta et al.
2016/0008555 A1     1/2016   Schraga
2017/0040374 A1     2/2017   Oh et al.

FOREIGN PATENT DOCUMENTS

KR    2009-0033636 A    4/2009
KR    2017-0017170 A    2/2017

\* cited by examiner

IMAGE SENSORS

CROSS-REFERENCE TO RELATED APPLICATION

This application is a continuation of U.S. application Ser. No. 16/108,348, filed on Aug. 22, 2018, which claims the benefit, under 35 U.S.C. § 119, of Korean Patent Application No. 10-2017-0151720, filed on Nov. 14, 2017, in the Korean Intellectual Property Office, the disclosure of each of which is incorporated herein in its entirety by reference.

BACKGROUND

The inventive concepts relate to image sensors, and more particularly, to image sensors including a photodiode.

An image sensor is an apparatus configured to convert an optical image signal into an electrical signal. An image sensor may include a pixel region including a plurality of photodiode regions which receive incident light and which convert the light into an electrical signal, and a pad region that surrounds the pixel region. As integration of such an image sensor increases, a size of each of the plurality of photodiode regions is reduced and, due to generation of a step difference between the pixel and the pad region, manufacturing processes of the image sensor become difficult or sensitivity of the image sensor deteriorates.

SUMMARY

The inventive concepts provide image sensors in which generation of a step difference between a pad region and a pixel region may be being prevented, and in which sensitivity of the image sensor is prevented from deteriorating.

The inventive concepts provide compact image sensors.

According to an aspect of the inventive concepts, an image sensor may include a semiconductor substrate including a pixel region and a pad region, a plurality of photoelectric conversion regions in the pixel region, an interconnect structure on a front surface of the semiconductor substrate, a pad structure in the pad region, the pad structure on a rear surface of the semiconductor substrate, a through via structure in the pad region, the through via structure electrically connected to the interconnect structure through the semiconductor substrate, and an isolation structure at least partially extending through the pad region of the semiconductor substrate from the rear surface of the semiconductor substrate. The isolation structure may surround the pad structure and the through via structure in a plane extending parallel to the rear surface of the semiconductor substrate.

According to an aspect of the inventive concepts, an image sensor may include a semiconductor substrate including a pixel region and a pad region, a plurality of photoelectric conversion regions in the pixel region, an interconnect structure on a front surface of the semiconductor substrate, a pad structure in the pad region, the pad structure embedded in the semiconductor substrate, the pad structure including an upper surface exposed to a rear surface of the semiconductor substrate, and an isolation structure at least partially extending through the pad region of the semiconductor substrate from the rear surface of the semiconductor substrate. The isolation structure may surround the pad structure in a plane extending parallel to the rear surface of the semiconductor substrate.

According to an aspect of the inventive concepts, an image sensor may include a semiconductor substrate including a pixel region and a pad region, a plurality of photoelectric conversion regions in the pixel region, an interconnect structure on a front surface of the semiconductor substrate, a pad structure in the pad region, the pad structure on a rear surface of the semiconductor substrate, a through via structure in the pad region, the through via structure electrically connected to the interconnect structure through the semiconductor substrate, and an isolation structure at least partially extending through the pad region of the semiconductor substrate from the rear surface of the semiconductor substrate. The isolation structure may surround the pad structure and the through via structure in a plane extending parallel to the rear surface of the semiconductor substrate. A portion of the semiconductor substrate overlapping the pad structure may be electrically insulated from another portion of the semiconductor substrate in the pixel region by the isolation structure.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
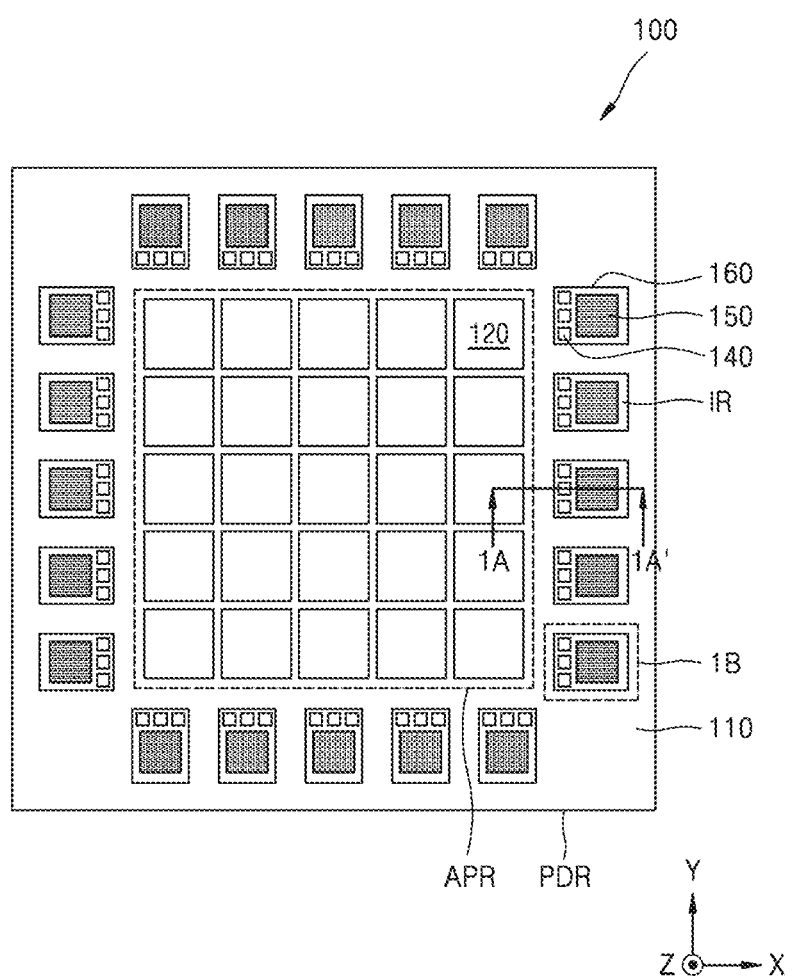
FIG. 1 is a layout diagram illustrating an image sensor according to some example embodiments.
Figure 2A:
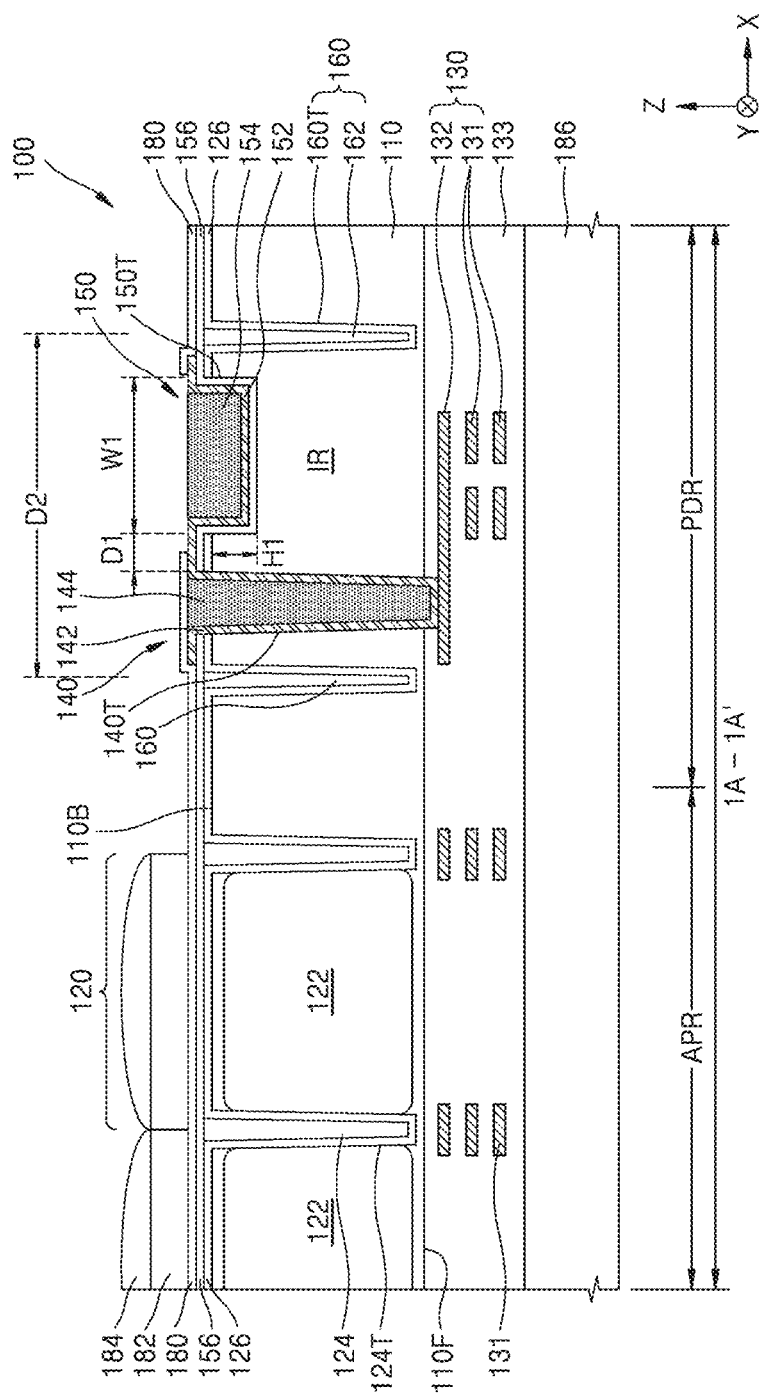
FIG. 2A is a cross-sectional view taken along line 1A-1A' of FIG. 1.
Figure 2B:
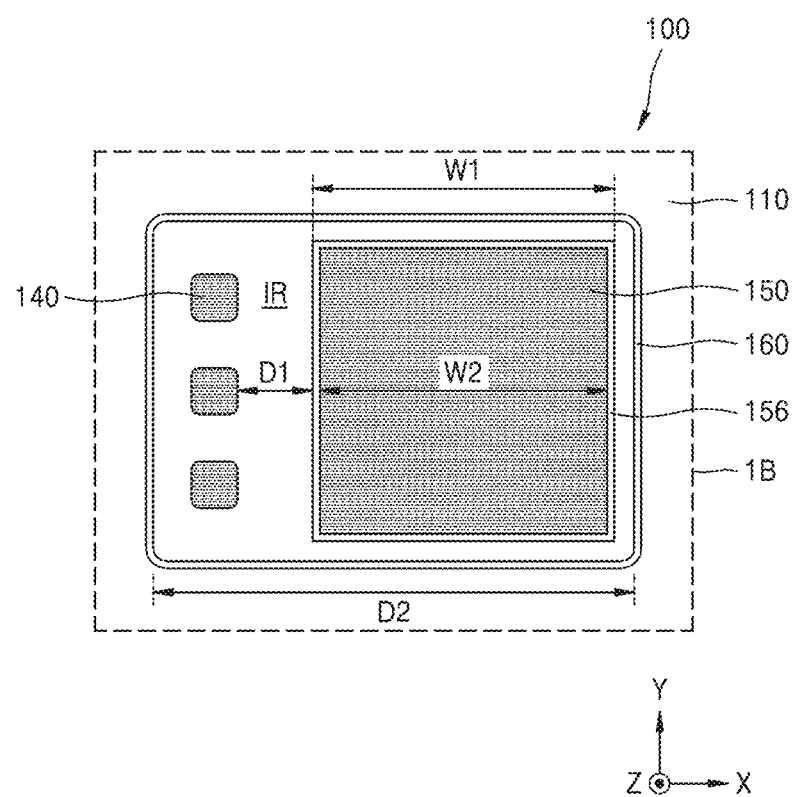
FIG. 2B is an enlarged view of portion 1B of FIG. 1.

FIG. 1 is a layout diagram illustrating an image sensor according to some example embodiments. FIG. 2A is a cross-sectional view taken along line 1A-1A' of FIG. 1. FIG. 2B is an enlarged view of portion 1B of FIG. 1.

Referring to FIGS. 1 to 2B, an image sensor 100 may include a pixel region APR including a plurality of photoelectric conversion regions 120 and a pad region PDR arranged on at least one side of the pixel region APR. As shown in FIG. 1, for example, the pad region PDR may surround the pixel region APR.

The pixel region APR may be arranged on a semiconductor substrate 110 to have an arbitrary shape. For example, as illustrated in FIG. 1, in the pixel region APR, the plurality of photoelectric conversion regions 120 may be arranged in a matrix while forming columns and rows in a first direction (for example, an X direction of FIG. 1) that runs parallel with an upper surface of the semiconductor substrate 110 and in a second direction (for example, a Y direction of FIG. 1) that runs parallel with the upper surface of the semiconductor substrate 110 to be perpendicular to the first direction. The pad region PDR may be arranged on the semiconductor substrate 110 to surround the pixel region APR.

The semiconductor substrate 110 may include a front surface 110F and a rear surface 110B opposite to each other. Here, for convenience sake, a surface of the semiconductor substrate 110 on which a color filter 182 is arranged is referred to as the rear surface 110B and a surface opposite to the rear surface 110B is referred to as the front surface 110F. However, the inventive concepts are not limited thereto. According to some example embodiments, the semiconductor substrate 110 may include a p-type semiconductor substrate. For example, the semiconductor substrate 110 may be formed of a p-type silicon substrate. According to some example embodiments, the semiconductor substrate 110 may include a p-type bulk substrate and a p-type or n-type epitaxial layer grown on the p-type bulk substrate. According to some example embodiments, the semiconductor substrate 110 may include an n-type bulk substrate and a p-type or n-type epitaxial layer grown on the n-type bulk substrate. The semiconductor substrate 110 may be formed of an organic plastic substrate.

In the pixel region APR, the plurality of photoelectric conversion regions 120 may be arranged in the semiconductor substrate 110. Each region of the plurality of photoelectric conversion regions 120 may include a photodiode region 122 and an impurity diffusion region (not shown).

Pixel isolation regions 124 partially pass ("extend") through the semiconductor substrate 110 and may be arranged between adjacent ones of the photoelectric conversion regions 120. The pixel isolation regions 124 may be formed in pixel isolation trenches 124T that partially pass through the semiconductor substrate 110. The plurality of photoelectric conversion regions 120 may be electrically insulated from neighboring photoelectric conversion regions 120 by the pixel isolation regions 124. The pixel isolation regions 124 are arranged between adjacent ones of the plurality of photoelectric conversion regions 120 arranged in a matrix as illustrated in FIG. 1 and may be grid or mesh-shaped. According to some example embodiments, the pixel isolation regions 124 may be formed of an insulation material such as a silicon oxide, a silicon nitride, or a silicon oxynitride.

A backside insulation layer 126 may be arranged on the rear surface 110B of the semiconductor substrate 110. The backside insulation layer 126 may be formed on the pixel region APR and the pad region PDR to a uniform thickness. In addition, as illustrated in FIG. 2A, the backside insulation layer 126 is conformally formed on the pixel isolation trenches 124T and the pixel isolation regions 124 may fill the pixel isolation trenches 124T on the backside insulation layer 126. According to some example embodiments, the backside insulation layer 126 may include an insulation material such as silicon oxide, silicon nitride, or silicon oxynitride. According to some example embodiments, the backside insulation layer 126 may include a metal oxide such as hafnium oxide, aluminum oxide, or tantalum oxide. In this case, the backside insulation layer 126 may operate as a negative fixed charge layer. According to some example embodiments, the backside insulation layer 126 is formed on internal walls of the pixel isolation trenches 124T and on the rear surface 110B of the semiconductor substrate 110. Then, the pixel isolation regions 124 that fill residing portion of the pixel isolation trenches 124T may be formed. According to some example embodiments, the backside insulation layer 126 and the pixel isolation regions 124 may be formed of the same material in the same process. In such a case, an interface between the backside insulation layer 126 and the pixel isolation region 124 may not be distinguished. As shown in at least FIG. 2A, a side wall of the backside insulation layer 126 may be exposed through an internal wall of the pad trench 150T, and the pad insulation layer 156 may extend on the side wall of the backside insulation layer 126.

A first interconnect structure 130 may be arranged on the front surface 110F of the semiconductor substrate 110. The first interconnect structure 130 may include a first interconnect layer 131 and a second interconnect layer 132. Each of the first interconnect layer 131 and the second interconnect layer 132 may be formed of a lamination structure of a plurality of layers. The first interconnect layer 131 and the second interconnect layer 132 may include at least one among polysilicon that are doped with impurities or that are not doped with impurities, a metal, a metal silicide, a metal nitride, and a metal containing layer. For example, the first interconnect layer 131 and the second interconnect layer 132 may include tungsten (W), aluminum (Al), copper (Cu), tungsten silicide, titanium silicide, tungsten nitride, titanium nitride, and doped polysilicon.

A first interlayer insulation layer 133 may be arranged to cover the first interconnect structure 130 on the front surface 110F of the semiconductor substrate 110. The first interlayer insulation layer 133 may include an insulation material such as silicon oxide, silicon nitride, or silicon oxynitride.

Although not shown, gate electrodes (not shown) that form a plurality of transistors may be formed on the front surface 110F of the semiconductor substrate 110 and the first interconnect structure 130 may further include a via structure (not shown) that connects between the gate electrodes and the first interconnect layer 131 or between the gate electrode and the second interconnect layer 132. The gate electrodes and the via structure may be covered with the first interlayer insulation layer 133.

According to some example embodiments, the plurality of transistors may include a transmission transistor (not shown) configured to transmit charges generated by the photoelectric conversion regions 120 to a floating diffusion region, a reset transistor (not shown) configured to periodically reset the charges stored in the floating diffusion region, a drive transistor (not shown) configured to function as a source follower buffer amplifier and to buffer a signal in accordance with the charges charged in the floating diffusion region, and a selection transistor (not shown) that performs switching and addressing in order to select the pixel region APR. However, the plurality of transistors are not limited thereto.

A through via structure 140 electrically connected to the first interconnect structure 130 may be arranged in the pad region PDR. A pad structure 150 electrically connected to the through via structure 140 may be arranged at one side of the through via structure 140. As shown in at least FIG. 2A, in the pad region PDR, an isolation structure 160 may be arranged to surround the through via structure 140 and the pad structure 150.

As illustrated in FIG. 2B, seen from the rear surface 110B of the semiconductor substrate 110 (for example, seen in a Z direction), the isolation structure 160 is arranged to surround the through via structure 140 and the pad structure 150 and the isolation structure 160 may not be arranged between the through via structure 140 and the pad structure 150. Restated, as shown in at least FIGS. 2A-2B, an isolation structure 160 may be arranged to surround the through via structure 140 and the pad structure 150 in a plane extending parallel to the rear surface 110B of the semiconductor substrate 110. A portion of the semiconductor substrate 110 at least partially limited ("defined") by the isolation structure 160 is referred to as an isolation region IR. The isolation region IR may refer to a portion of the semiconductor substrate 110 that overlaps the through via structure 140 and the pad structure 150. As shown in at least FIG. 2A, the isolation region IR and the pad structure 150 may overlap each other in a direction extending perpendicular to the rear surface 110B of the semiconductor substrate 110 (e.g., "may vertically overlap"). As shown in at least FIG. 2A, the isolation structure 160 may be not between the through via structure 140 and the pad structure 150 within the semiconductor substrate 110. Restated, the pad structure 150 and the through via structure 140 may be collectively surrounded by the isolation structure 160 in the plane extending parallel to the rear surface 110B of the semiconductor substrate 110. The through via structure 140 may overlap the pad structure 150 in a direction extending perpendicular to the rear surface 110B of the semiconductor substrate 110.

The isolation region IR is surrounded by the ring-shaped isolation structure 160 and one pad structure 150 and three through via structures 140 may be arranged in the isolation region IR. The inventive conception is not limited thereto. A plurality of pad structures 150 and a plurality of through via structures 140 may be arranged in the isolation region IR.

The through via structure 140 may be arranged to fill the through via trench 140T that passes through the semiconductor substrate 110. The through via trench 140T may extend from the front surface 110F to the rear surface 110B of the semiconductor substrate 110 over an entire thickness of the semiconductor substrate 110 (e.g., through the semiconductor substrate 110). In FIG. 2A, a width of the through via trench 140T at a level the same as that of the rear surface 110B of the semiconductor substrate 110 is slightly larger than a width of the through via trench 140T at a level the same as that of the front surface 110F. However, the inventive concepts are not limited thereto.

The through via structure 140 may include a first via conductive layer 142 conformally formed on an internal wall of the through via trench 140T and a second via conductive layer 144 formed on the first via conductive layer 142 to fill the through via trench 140T. The first via conductive layer 142 may extend from the internal wall of the through via trench 140T onto the backside insulation layer 126. The first via conductive layer 142 may include a metal such as Ti, titanium nitride (TiN), tantalum (Ta), tantalum nitride (TaN), TiW, W, Al, cobalt (Co), nickel (Ni), or Cu. The second via conductive layer 144 may include a metal such as W, Al, Co, Ni, or Cu. For example, each of the first via conductive layer 142 and the second via conductive layer 144 may be formed of ("may at least partially comprise") a single metal layer or a double layer of a plurality of metal materials. The second via conductive layer 144 may include a material different from the first via conductive layer 142. However, the inventive concepts are not limited thereto. In addition, as illustrated in FIG. 2A, the second via conductive layer 144 may completely fill the through via trench 140T. Unlike in FIG. 2A, the second via conductive layer 144 may fill only a portion (for example, an upper side wall of the through via trench 140T) of the through via trench 140T. As shown in FIG. 2A, the second via conductive layer 144 may be isolated from direct contact with the pad trench 150T, and the first via conductive layer 142 may be connected to the pad trench 150T and may be connected to at least one of the first pad conductive layer 152 and the second pad conductive layer 154.

The through via structure 140 may be electrically connected to the first interconnect structure 130 through the semiconductor substrate 110. For example, as illustrated in FIG. 2A, the through via structure 140 may be arranged so that an end of the first via conductive layer 142 contacts the second interconnect layer 132.

The pad structure 150 may be arranged on the rear surface 110B of the semiconductor substrate 110 to be spaced apart, isolated from direct contact with, or separate from the through via structure 140 in a direction parallel with a front surface 110F of the semiconductor substrate 110. The pad structure 150 may be arranged in a pad trench 150T formed on the rear surface 110B of the semiconductor substrate 110 to have a first depth H1. The pad structure 150 may have a bottom surface positioned at a lower level than (e.g., "proximate to the front surface 110F of the semiconductor substrate 110 in relation to") the rear surface 110B of the semiconductor substrate 110. The pad structure 150 is buried or embedded in the semiconductor substrate 110. An upper surface of the pad structure 150 may be exposed to the rear surface 110B of the semiconductor substrate 110. The pad structure may be a burial type pad in which at least a portion of the pad structure 150 is buried in the semiconductor substrate 110.

The pad structure 150 may include a first pad conductive layer 152 conformally formed on an internal wall of the pad trench 150T and contacting and/or embedded in the semiconductor substrate 110 and a second pad conductive layer 154 that fills a residual portion of the pad trench 150T on the first pad conductive layer 152. A pad insulation layer 156 may be between the pad trench 150T and the first pad conductive layer 152, such that the first pad conductive layer 152 is on the pad insulation layer 156, and the second pad conductive layer 154 is on the pad insulation layer 156. Furthermore the pad insulation layer 156 may be between the second pad conductive layer 154 and the semiconductor substrate 110 and the pad insulation layer 156 may be between the first pad conductive layer 152 and the semiconductor substrate 110, and the second pad conductive layer 154 may be isolated from direct contact with the semiconductor substrate 110 (e.g., by at least the pad insulation layer 156) as a result.

The pad insulation layer 156 may be arranged on (e.g., may extend conformally on) an internal wall of the pad trench 150T in an entire area of the rear surface 110B of the semiconductor substrate 110, wherein the pad trench 150T extends into the semiconductor substrate 110 from the rear surface 110B of the semiconductor substrate 110. The pad insulation layer 156 may be arranged on the backside insulation layer 126 in both of the pixel region APR and the pad region PDR. The pad insulation layer 156 may be formed of an insulation material such as silicon oxide, silicon nitride, or silicon oxynitride. The pad insulation layer 156 may have a first thickness of about several to about several thousand Å in a third direction (a Z direction) perpendicular to an upper surface (e.g., rear surface 110B) of the semiconductor substrate 110.

As the pad structure 150 is arranged in the isolation region IR, since sufficient electric insulation may be secured between the pad structure 150 and the pixel region APR, the first thickness of the pad insulation layer 156 may be relatively small. The pad insulation layer 156 is formed on an entire upper surface of the pixel region APR and the pad region PDR and the pad insulation layer 156 arranged on the pixel region APR may operate as an anti-reflection layer. Therefore, if the first thickness of the pad insulation layer 156 is large, sensitivity of the image sensor may deteriorate. However, since the pad structure 150 is arranged in the isolation region IR, the first thickness of the pad insulation layer 156 may be relatively small so that sensitivity of the pixel region APR may not deteriorate.

The first pad conductive layer 152 may extend from the internal wall of the pad trench 150T to the rear surface 110B of the semiconductor substrate 110 and may be connected to the first via conductive layer 142. The first pad conductive layer 152 may include a metal such as Ti, TiN, Ta, TaN, TiW, W, Al, Co, Ni, or Cu. For example, each of the first pad conductive layer 152 and the second pad conductive layer 154 may be formed of a single metal layer or a double layer of a plurality of metal materials. The second pad conductive layer 154 may include a material different from the first pad conductive layer 152. However, the inventive concepts are not limited thereto.

The pad structure 150 may be electrically connected to the first interconnect structure 130 through the through via structure 140. An external connection terminal (not shown) may be arranged on the pad structure 150. Through the external connection terminal, an image signal, a control signal, or a power voltage may be provided or transmitted to the first interconnect structure 130.

The isolation structure 160 may include an isolation insulation layer 162. The isolation insulation layer 162 may fill an isolation trench 160T that at least partially passes ("extends") through the semiconductor substrate 110 in the pad region PDR, such that the isolation structure 160 at least partially extends through the pad region PDR from the rear surface 110B of the semiconductor substrate 110. The isolation insulation layer 162 may include an insulation material such as silicon oxide, silicon nitride, and silicon oxynitride. As illustrated in FIG. 2A, the backside insulation layer 126 is conformally formed on the isolation trench 160T and the isolation insulation layer 162 may fill the isolation trench 160T on the backside insulation layer 126. However, the inventive concepts are not limited thereto.

As illustrated in FIG. 2B, seen from the rear surface 110B of the semiconductor substrate 110, the isolation structure 160 is separate from the through via structure 140 and the pad structure 150 by a particular (or, alternatively, predetermined) distance and is ring-shaped to surround the through via structure 140 and the pad structure 150. The isolation structure 160 has a square ring-shaped cross-section, a polygonal ring-shaped cross-section, a rounded square ring-shaped cross-section, an elliptical ring-shaped cross-section, or the like. However, the inventive concepts are not limited thereto.

As illustrated in FIG. 2B, the isolation structure 160 is arranged at one side of the through via structure 140 and the pad structure 150 may be arranged on the other side opposite to the one side of the through via structure 140. The isolation structure 160 may not be arranged in a region between the through via structure 140 and the pad structure 150. In FIG. 2B, the pad structure 150 and the through via structure 140 do not overlap the isolation structure 160. However, unlike in FIG. 2B, portions of the first pad conductive layer 152 and the first via conductive layer 142 may extend onto the rear surface 110B of the semiconductor substrate 110 by a particular (or, alternatively, predetermined) length and may overlap the isolation structure 160. In some example embodiments, and as shown in at least FIG. 2A, the first via conductive layer 142 and the first pad conductive layer 152 do not overlap the isolation structure 160 in a direction extending perpendicular to the rear surface 110B of the semiconductor substrate 110.

As illustrated in FIG. 2B, the pad trench 150T may have a first width W1 in a first direction (an X direction of FIG. 2B) that runs parallel with the upper surface of the semiconductor substrate 110. The pad trench 150T may be separate from the through via trench 140T by a first distance D1 in a first direction. Both side walls that face each other in the first direction of the isolation structure 160 may be separate from each other by a second distance D2. That is, a width of the isolation region IR in the first direction may correspond to the second distance D2. In the isolation region IR, since the pad trench 150T and the through via trench 140T may be separate from each other by the first distance D1, which is relatively small, an area of the pad region PDR may be reduced.

In addition, as the pad insulation layer 156 is formed to a small thickness, the second width W2 of the pad structure 150 arranged in the pad trench 150T in the first direction may be relatively large.

As illustrated in FIGS. 2A and 2B, as the isolation structure 160 may be arranged to at least partially pass through the semiconductor substrate 110 and to surround the pad structure 150 and the through via structure 140, the isolation region IR (e.g., the portion of the semiconductor substrate 110 overlapping the pad structure 150) may be electrically insulated from another portion of the semiconductor substrate 110 by the isolation structure 160. For example, the isolation region IR may be electrically insulated from the semiconductor substrate 110 of the pixel region APR and the isolation region IR may be electrically insulated from another neighboring isolation region IR.

A passivation layer 180 may be arranged on a portion of an upper surface of the pad structure 150, the pad insulation layer 156, and the through via structure 140. The passivation layer 180 may cover the entire pixel region APR. An entire upper surface of the pad region PDR excluding a portion of the upper surface of the pad structure 150 may be covered with the passivation layer 180. The passivation layer 180 may include an insulation material such as silicon oxide, silicon nitride, and silicon oxynitride.

In the pixel region APR, a color filter 182 and a micro-lens 184 may be arranged on the passivation layer 180. On the front surface 110F of the semiconductor substrate 110, a supporting substrate 186 may be arranged with the first interlayer insulation layer 133 interposed therebetween.

In general, when the pad structure is arranged on the rear surface 110B of the semiconductor substrate 110, a step difference may be generated between the upper surface of the pixel region APR and the upper surface of the pad region PDR due to a thickness of the pad structure. In a process of forming the color filter 182 on the pixel region APR, a patterning process defect may occur due to the step different. However, according to the above example embodiments, since the pad structure 150 may have a burial type pad structure in which the pad structure 150 is arranged in the pad trench 150T, it may prevent a step difference from being generated between the upper surface of the pixel region APR and the upper surface of the pad region PDR and to prevent a patterning defect from occurring in a process of forming the color filter.

Additionally, in the burial type pad structure, in order to electrically insulate the pad structure 150 from the semiconductor substrate 110, the pad insulation layer 156 of a sufficient thickness may be formed. In this case, since the pad insulation layer 156 arranged on the pixel region APR operates as a reflection preventing layer, sensitivity of the image sensor may deteriorate. However, according to the above example embodiments, since the isolation structure 160 is arranged to surround the pad structure 150 and the through via structure 140, the pad structure 150 arranged in the isolation region IR may be sufficiently electrically insulated from the semiconductor substrate 110 outside the isolation region IR. Therefore, the pad insulation layer 156 may be thin, and thus, it may prevent sensitivity of the image sensor 100 from deteriorating, which occurs in a case that the thick pad insulation layer 156 is arranged on the pixel region APR.

In addition, according to the above-described example embodiments, since the pad structure 150 and the through via structure 140 are separate from each other by a small distance in the isolation region IR, an area of the pad region PDR may be reduced. Therefore, the image sensor may be compact.

In summary, the image sensor 100 according to the above-described example embodiments may have improved sensitivity and may be compact. In addition, it may prevent a patterning defect from being generated in manufacturing processes of the image sensor 100.

Figure 3:
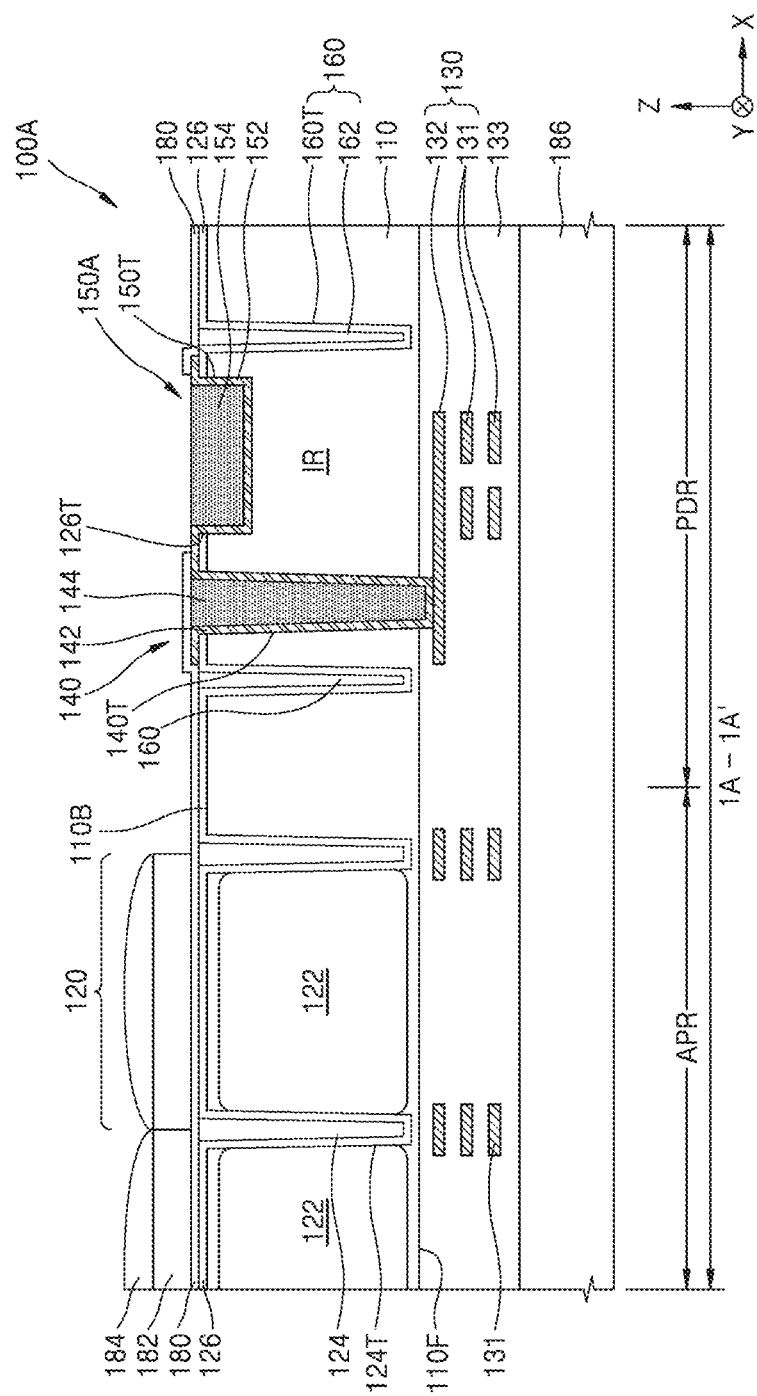
FIG. 3 is a cross-sectional view illustrating an image sensor according to some example embodiments.

FIG. 3 is a cross-sectional view illustrating an image sensor 100A according to some example embodiments. FIG. 3 illustrates a cross-section taken along the line 1A-1A'. In FIG. 3, the same reference numerals as those of FIGS. 1 and 2B denote the same elements. In FIG. 3, the pad insulation layer 156 described with reference to FIG. 2A may not be formed.

Referring to FIG. 3, a pad structure 150A may include the first pad conductive layer 152 formed on an internal wall of the pad trench 150T and the second pad conductive layer 154 that fills the residual portion of the pad trench 150T on the first pad conductive layer 152.

As illustrated in FIG. 3, the first pad conductive layer 152 may directly contact the semiconductor substrate 110. In addition, as the pad insulation layer 156 is not formed, the first pad conductive layer 152 may directly contact the backside insulation layer 126. The backside insulation layer 126 may include a side wall 126T exposed by the pad trench 150T and the first pad conductive layer 152 may extend onto the side wall 126T of the backside insulation layer 126.

In the pad region PDR, since the through via structure 140 and the pad structure 150A are surrounded by the isolation structure 160, the isolation region IR may be electrically insulated from the semiconductor substrate 110 other than the isolation region IR. Therefore, the pad insulation layer 156 for insulating the pad structure 150 from the semiconductor substrate 110 may be omitted.

Since the pad insulation layer 156 is not formed on both the pixel region APR and the pad region PDR, it may prevent sensitivity of the image sensor 100A from deteriorating, which occurs in a case that the thick pad insulation layer 156 is arranged on the pixel region APR.

Figure 4:
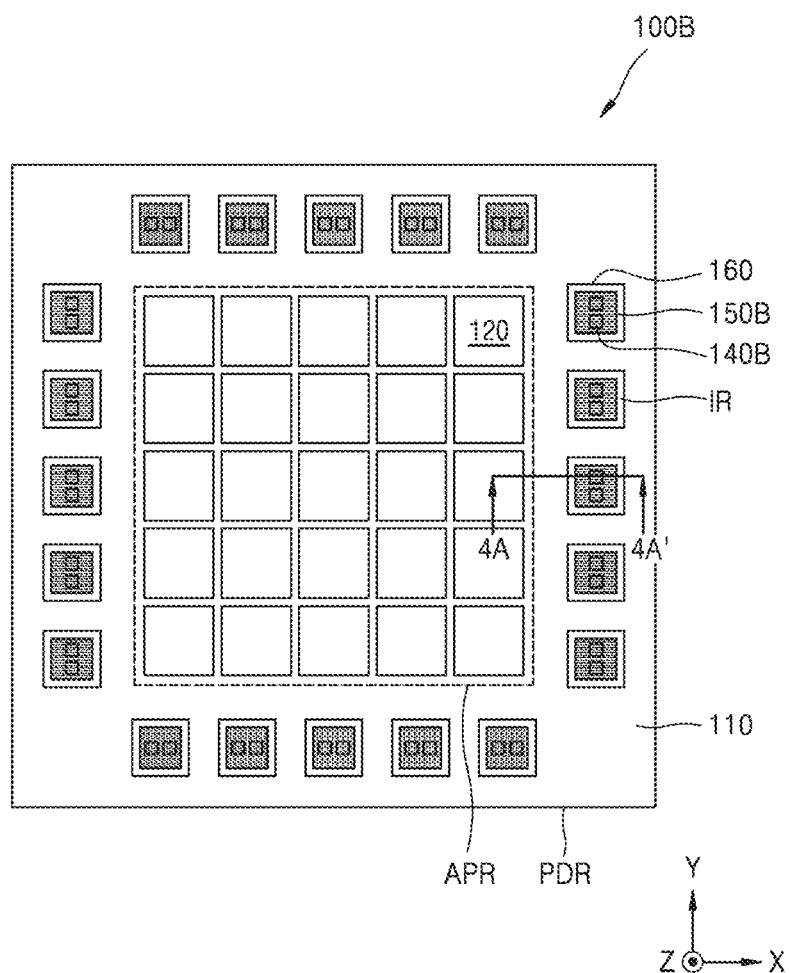
FIG. 4 is a layout diagram illustrating an image sensor according to some example embodiments.
Figure 5:
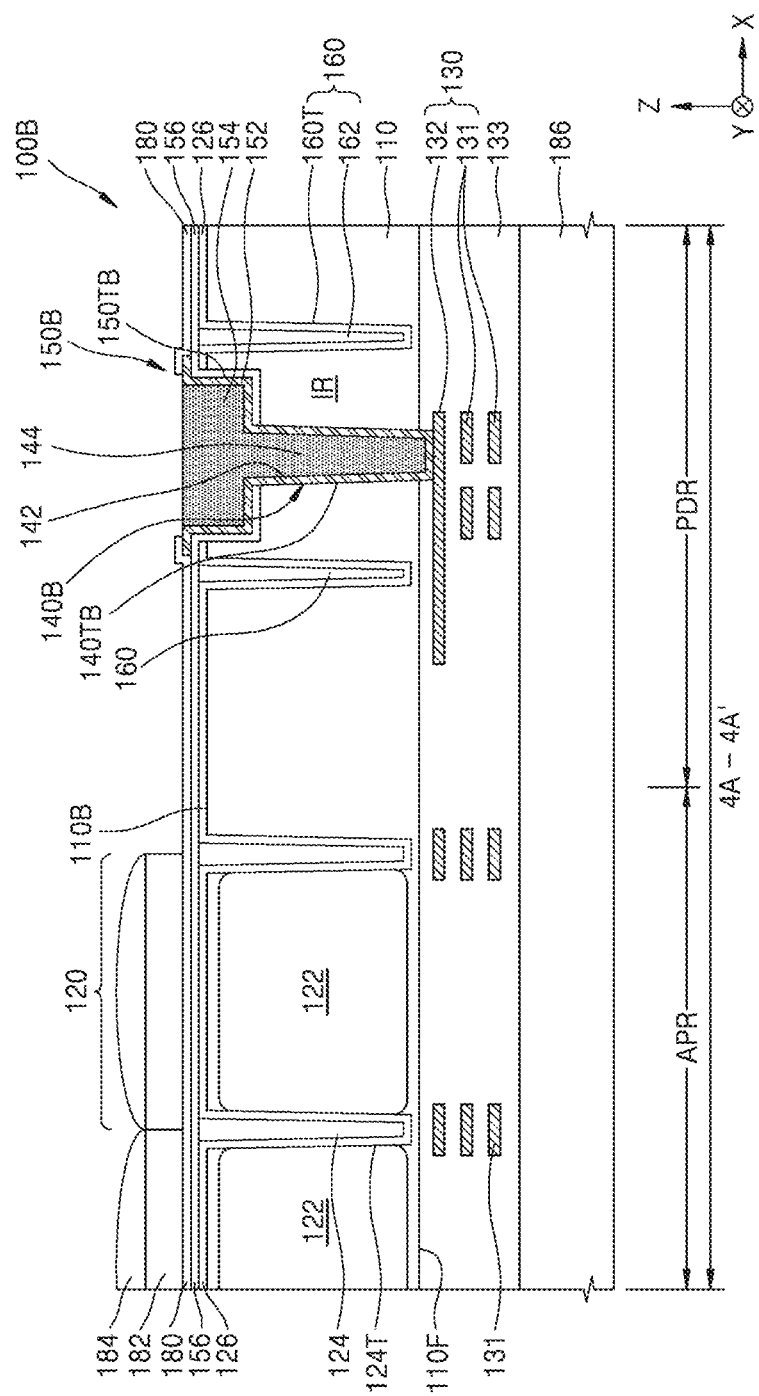
FIG. 5 is a cross-sectional view taken along line 4A-4A' of FIG. 4.

FIG. 4 is a layout diagram illustrating an image sensor 100B according to some example embodiments. FIG. 5 is a cross-sectional view taken along line 4A-4A' of FIG. 4. In FIGS. 4 and 5, the same reference numerals as those of FIGS. 1 to 3 denote the same elements.

Referring to FIGS. 4 and 5, a through via structure 140B and a pad structure 150B may be arranged to overlap each other. Seen from the rear surface 110B of the semiconductor substrate 110, the through via structure 140B and the pad structure 150B are arranged to overlap and the isolation structure 160 may surround entire side wall of the pad structure 150B.

A through via trench 140TB may extend from the front surface 110F of the semiconductor substrate 110 toward the rear surface 110B to a particular (or, alternatively, predetermined) depth and may be connected to (or communicated with) a pad trench 150TB. The pad trench 150TB may extend from the rear surface 110B of the semiconductor substrate 110 toward the front surface 110F and may be connected to an upper end of the through via trench 140TB.

The first via conductive layer 142 is conformally formed on an internal wall of the through via trench 140TB. The first via conductive layer 142 and the first pad conductive layer 152 may be connected to each other at a connection point of the through via trench 140TB and the pad trench 150TB.

According to some example embodiments, the first via conductive layer 142 and the first pad conductive layer 152 may be formed of the same material in the same process. In such a case, as illustrated in FIG. 5, one conductive material may be continuously formed on internal walls of the through via trench 140TB and the pad trench 150TB. According to some example embodiments, the first pad conductive layer 152 is formed after the first via conductive layer 142 is formed or the first via conductive layer 142 may be formed after the first pad conductive layer 152 is formed.

The second via conductive layer 144 may be connected to the second pad conductive layer 154 while filling the through via trench 140TB. According to some example embodiments, the second via conductive layer 144 and the second pad conductive layer 154 may be formed of the same material in the same process.

According to the above-described example embodiments, as the pad structure 150B and the through via structure 140B are arranged to overlap each other in the isolation region IR, an area of the pad region PDR may be reduced and the image sensor 100B may be compact.

In addition, although the pad insulation layer 156 has a relatively small thickness, the pad structure 150B arranged in the isolation region IR may be sufficiently electrically insulated from a portion of the semiconductor substrate 110 outside the isolation region IR. Therefore, it may prevent sensitivity of the image sensor 100B from deteriorating, which occurs in a case that the thick pad insulation layer 156 is arranged on the pixel region APR.

Figure 6:
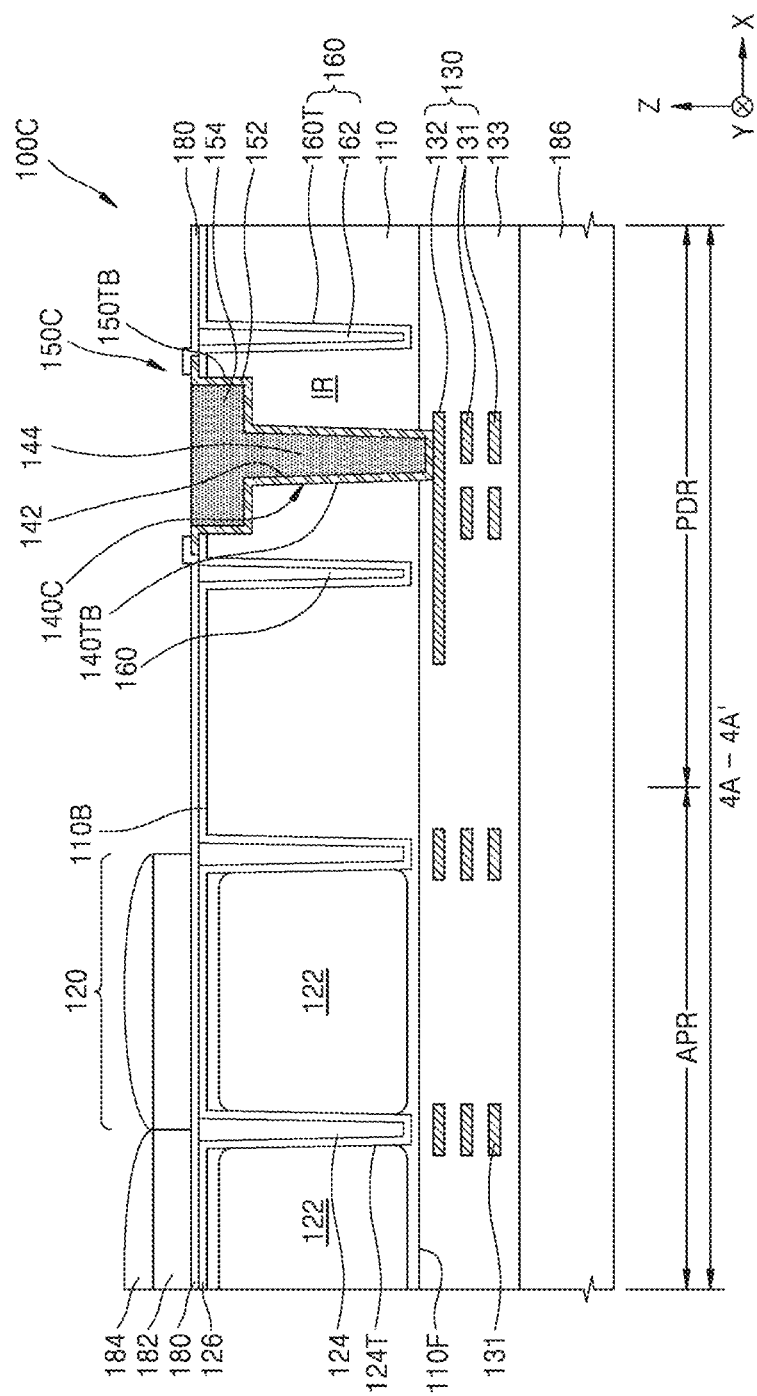
FIG. 6 is a cross-sectional view illustrating an image sensor according to some example embodiments.

FIG. 6 is a cross-sectional view illustrating an image sensor 100C according to some example embodiments. FIG. 6 illustrates a cross-section taken along the line 4A-4A' of FIG. 4. In FIG. 6, the same reference numerals as those of FIGS. 1 to 5 denote the same elements.

Referring to FIG. 6, a through via structure 140C and a pad structure 150C may be arranged to overlap each other. The pad insulation layer 156 (refer to FIG. 5) may not be formed between the pad structure 150C and the pad trench 150TB. The pad structure 150C may include the first pad conductive layer 152 that directly contacts the internal wall of the pad trench 150TB and the second pad conductive layer 154 that fills a residual portion of the pad trench 150TB on the first pad conductive layer 152.

According to the above-described example embodiments, since the pad structure 150C and the through via structure 140C are arranged to overlap in the isolation region IR, an area of the pad region PDR may be reduced and the image sensor 100C may be compact.

In addition, although the pad insulation layer 156 is not formed both of the pixel region APR and the pad region PDR, the pad structure 150C arranged in the isolation region IR may be sufficiently electrically insulated from a portion of the semiconductor substrate 110 outside the isolation region IR. Therefore, it may prevent sensitivity of the image sensor 100C from deteriorating, which occurs in a case that the thick pad insulation layer 156 is arranged on the pixel region APR.

Figure 7:
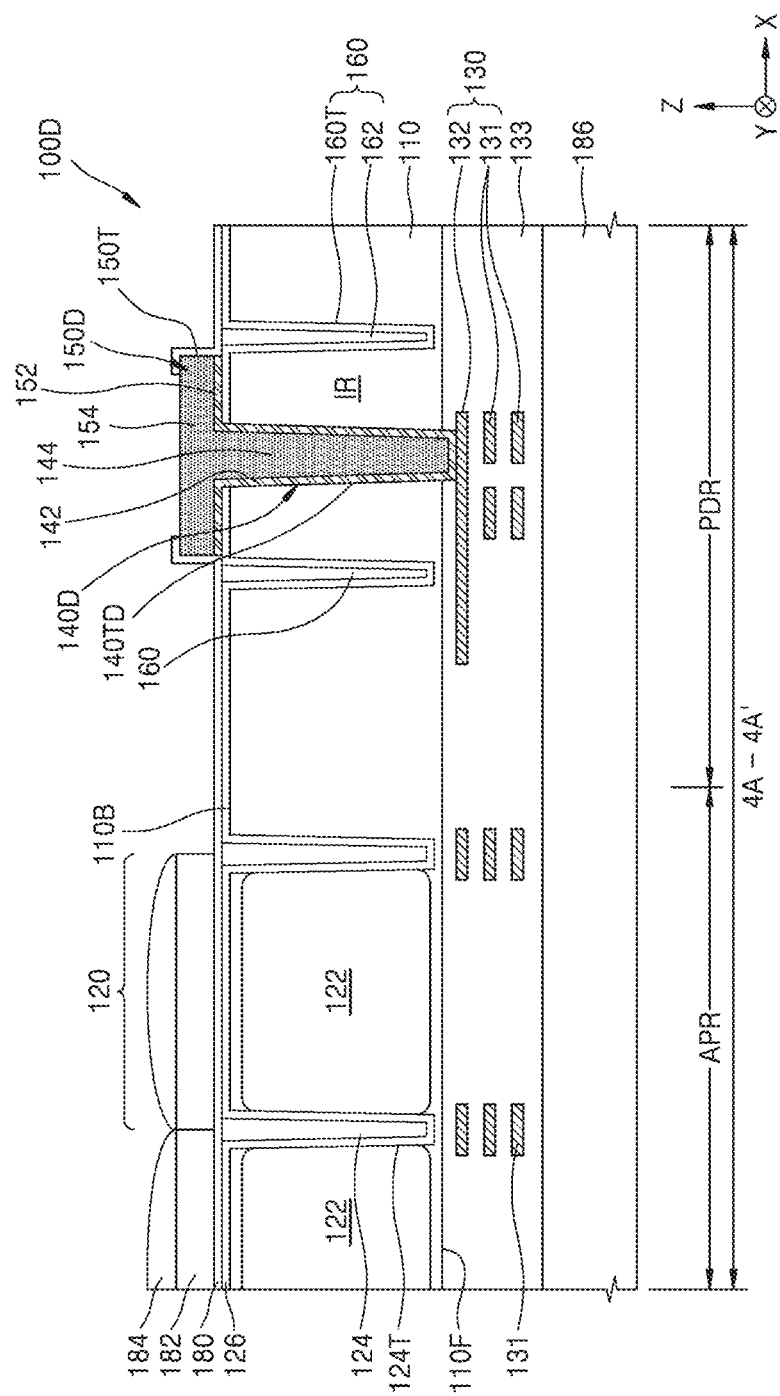
FIG. 7 is a cross-sectional view illustrating an image sensor according to some example embodiments.

FIG. 7 is a cross-sectional view illustrating an image sensor 100D according to some example embodiments. FIG. 7 illustrates a cross-section taken along the line 4A-4A' of FIG. 4. In FIG. 7, the same reference numerals as those of FIGS. 1 to 6 denote the same elements. In FIG. 7, the pad trench 150TB described with reference to FIG. 5 may not be formed.

Referring to FIG. 7, a through via trench 140TD may extend to pass through the semiconductor substrate 110 and a pad structure 150D may be on a through via structure 140D. For example, the pad structure 150D may include the first pad conductive layer 152 and the second pad conductive layer 154 that are sequentially formed on the backside insulation layer 126, and the backside insulation layer 126 may be connected to the isolation structure 160. Additionally, the pad structure 150D may be on the backside insulation layer 126. The through via structure 140D and the pad structure 150D may be arranged to overlap. As shown in FIG. 7, the pad structure 150D may have a bottom surface positioned at a higher level than (e.g., "distal from the semiconductor substrate 110 in relation to") the rear surface 110B of the semiconductor substrate 110.

According to the above-described example embodiments, since the pad structure 150D and the through via structure 140D are arranged to overlap in the isolation region IR, an area of the pad region PDR may be reduced and the image sensor 100D may be compact.

In addition, although the pad insulation layer is not formed on both the pixel region APR and the pad region PDR, the pad structure 150D arranged in the isolation region IR may be sufficiently electrically insulated from a portion of the semiconductor substrate 110 outside the isolation region IR. Therefore, it may prevent sensitivity of the image sensor 100D from deteriorating, which occurs in a case that the thick pad insulation layer 156 is arranged on the pixel region APR.

Figure 8:
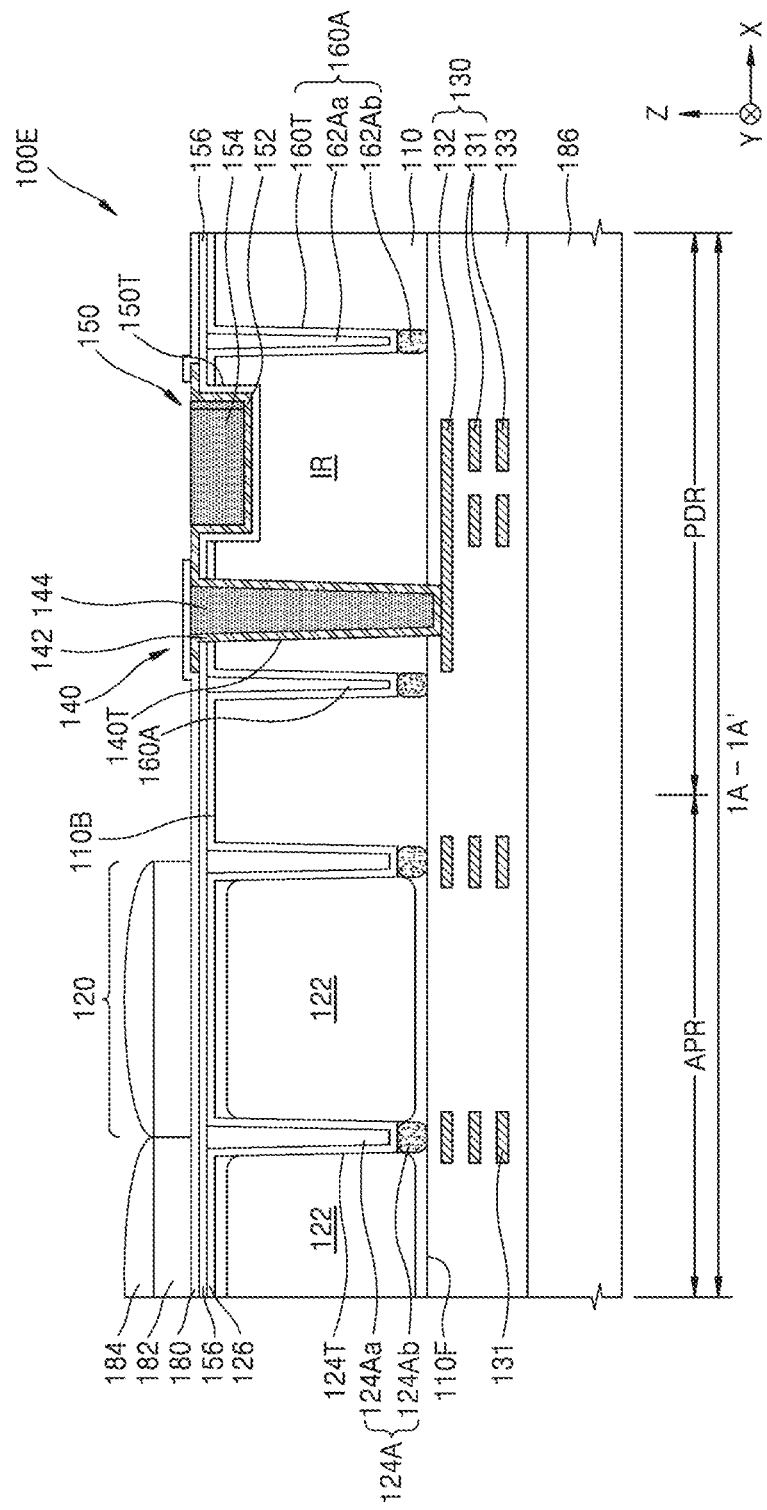
FIG. 8 is a cross-sectional view illustrating an image sensor according to some example embodiments.

FIG. 8 is a cross-sectional view illustrating an image sensor 100E according to some example embodiments. FIG. 8 illustrates a cross-section taken along the line 1A-1A' of FIG. 1. In FIG. 8, the same reference numerals as those of FIGS. 1 to 7 denote the same elements.

Referring to FIG. 8, a pixel isolation region 124A may include a pixel isolation insulation layer 124Aa and an impurity region 124Ab. The pixel isolation trench 124T may extend from the rear surface 110B of the semiconductor substrate 110 toward the front surface 110F so as to partially pass through the semiconductor substrate 110. The pixel isolation insulation layer 124Aa may fill the pixel isolation trench 124T. The impurity region 124Ab may be formed under the pixel isolation insulation layer 124Aa.

An isolation structure 160A may include an isolation insulation layer 162Aa and an impurity region 162Ab. An isolation trench 160T may extend from the rear surface 110B of the semiconductor substrate 110 toward the front surface 110F so as to partially pass through the semiconductor substrate 110. The isolation insulation layer 162Aa may fill the isolation trench 160T. The impurity region 162Ab may be formed under the isolation insulation layer 162Aa.

Figure 9:
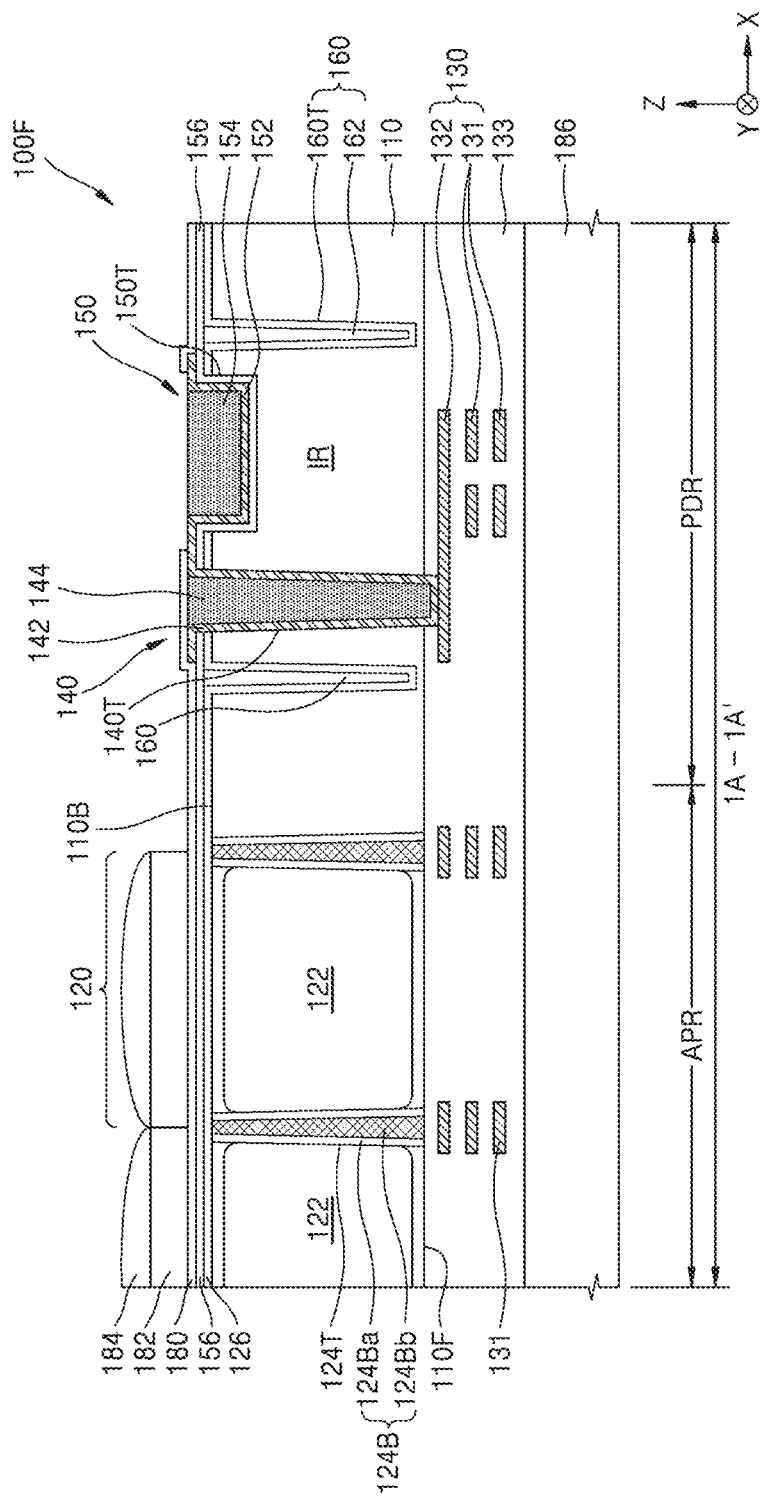
FIG. 9 is a cross-sectional view illustrating an image sensor according to some example embodiments.

FIG. 9 is a cross-sectional view illustrating an image sensor 100F according to some example embodiments. FIG. 9 illustrates a cross-section taken along the line 1A-1A' of FIG. 1. In FIG. 9, the same reference numerals as those of FIGS. 1 to 8 denote the same elements.

Referring to FIG. 9, a pixel isolation region 124B may include a pixel isolation insulation layer 124Ba and a pixel isolation conductive layer 124Bb. The pixel isolation trench 124T may extend from the front surface 110F of the semiconductor substrate 110 toward the rear surface 110B so as to pass through the semiconductor substrate 110. The pixel isolation insulation layer 124Ba is conformally formed on a side wall of the pixel isolation trench 124T and the pixel isolation conductive layer 124Bb may fill the pixel isolation trench 124T on the pixel isolation insulation layer 124Ba.

In FIG. 9, the pixel isolation trench 124T extends from the front surface 110F of the semiconductor substrate 110 toward the rear surface 110B so as to pass through the semiconductor substrate 110. The pixel isolation trench 124T is illustrated as having the largest width at the same level as the front surface 110F of the semiconductor substrate 110. However, according to some example embodiments, the pixel isolation trench 124T extends from the rear surface 110B of the semiconductor substrate 110 toward the front surface 110F so as to pass through the semiconductor substrate 110 and the pixel isolation trench 124T may have the largest width at the same level as the rear surface 110B of the semiconductor substrate 110.

Although not shown, an additional interconnect structure (not shown) electrically connected to the pixel isolation conductive layer 124Bb may be formed. A negative voltage may be applied to the pixel isolation conductive layer 124Bb through the additional interconnect structure. Therefore, since it may prevent holes from being accumulated on a surface of the pixel isolation insulation layer 124Ba, it may reduce generation of a dark current of the image sensor 100F.

Figure 10:
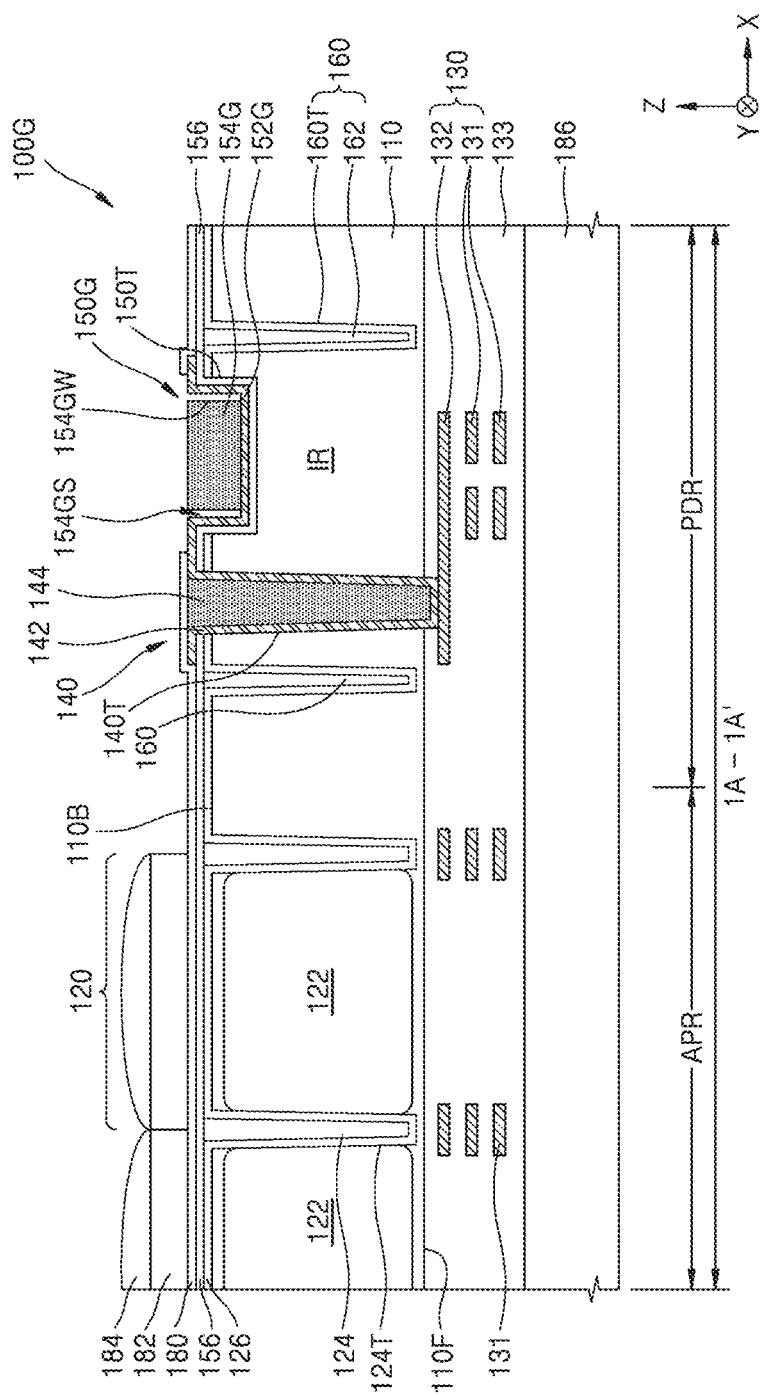
FIG. 10 is a cross-sectional view illustrating an image sensor according to some example embodiments.

FIG. 10 is a cross-sectional view illustrating an image sensor 100G according to some example embodiments. FIG. 10 illustrates a cross-section taken along the line 1A-1A' of FIG. 1. In FIG. 10, the same reference numerals as those of FIGS. 1 to 9 denote the same elements.

Referring to FIG. 10, a pad structure 150G may include a first pad conductive layer 152G conformally formed on an internal wall of the pad trench 150T and a second pad conductive layer 154G formed on the first pad conductive layer 152G not to completely fill the pad trench 150T. A gap 154GS may be formed between a side wall 154GW of the second pad conductive layer 154G and the first pad conductive layer 152G arranged on a side wall of the pad trench 150T. According to some example embodiments, the second pad conductive layer 154G may be formed by forming the first pad conductive layer 152G on an internal wall of the pad trench 150T, forming a conductive layer (not shown) on the first pad conductive layer 152G to fill the pad trench 150T, and patterning the conductive layer.

Figure 11:
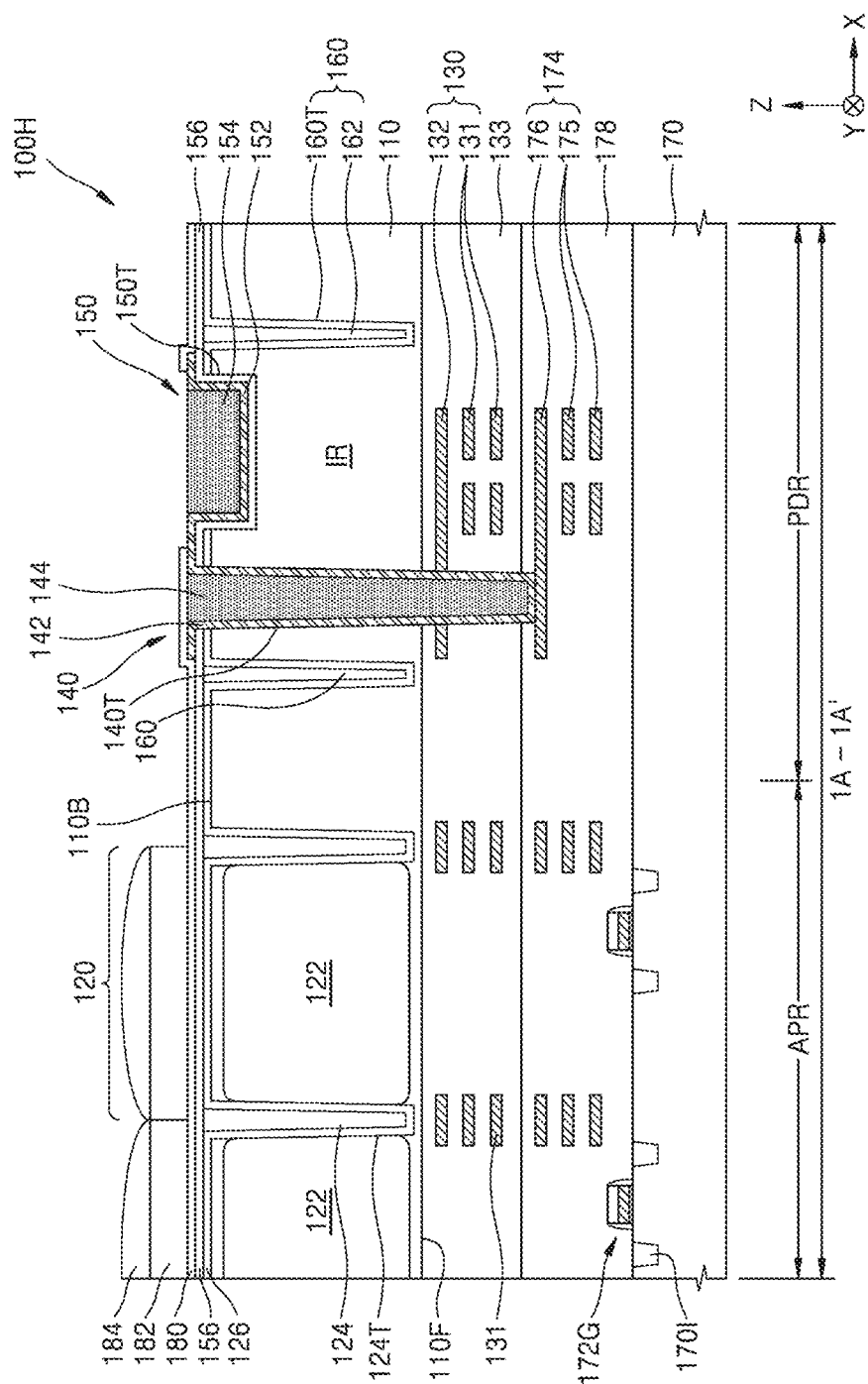
FIG. 11 is a cross-sectional view illustrating an image sensor according to some example embodiments.

FIG. 11 is a cross-sectional view illustrating an image sensor 100H according to some example embodiments. FIG. 11 illustrates a cross-section taken along the line 1A-1A' of FIG. 1. In FIG. 11, the same reference numerals as those of FIGS. 1 to 10 denote the same elements.

Referring to FIG. 11, the image sensor 100H may have a stacking structure in which the semiconductor substrate 110 and a lower substrate 170 are attached to each other.

In the lower substrate 170, an active region (not shown) limited by isolation layers 1701 may be formed. Gate structures 172G may be arranged on the lower substrate 170. The gate structures 172G may configure a plurality of complementary metal-oxide-semiconductor (CMOS) transistors for providing a uniform signal to the respective photoelectric conversion regions 120 or for controlling output signals from the respective photoelectric conversion regions. For example, the transistor may configure each of various kinds of logic circuits such as a timing generator, a row decoder, a row driver, a correlated double sampler (CDS), an analog to digital converter (ADC), a latch, and a column decoder. However, the inventive concepts are not limited thereto.

A second interconnect structure 174 may be formed above the lower substrate 170. The second interconnect structure 174 may include a third interconnect layer 175 and a fourth interconnect layer 176. A second interlayer insulation layer 178 may be arranged on the lower substrate 170 to cover the gate structures 172G and the second interconnect structure 174.

The first interlayer insulation layer 133 may be attached on the second interlayer insulation layer 178. According to some example embodiments, the first interlayer insulation layer 133 and the second interlayer insulation layer 178 may be attached to each other by an oxide-oxide direct bonding method. According to some example embodiments, an adhesive member (not shown) may be interposed between the first interlayer insulation layer 133 and the second interlayer insulation layer 178.

The through via trench 140T passes through the semiconductor substrate 110 and the first interlayer insulation layer 133 and may be connected to a portion of the second interconnect structure 174. As illustrated in FIG. 11, the through via structure 140 is connected to both the first interconnect structure 130 and the second interconnect structure 174 and a bottom of the through via structure 140 may be surrounded by the second interlayer insulation layer 178.

Figure 12:
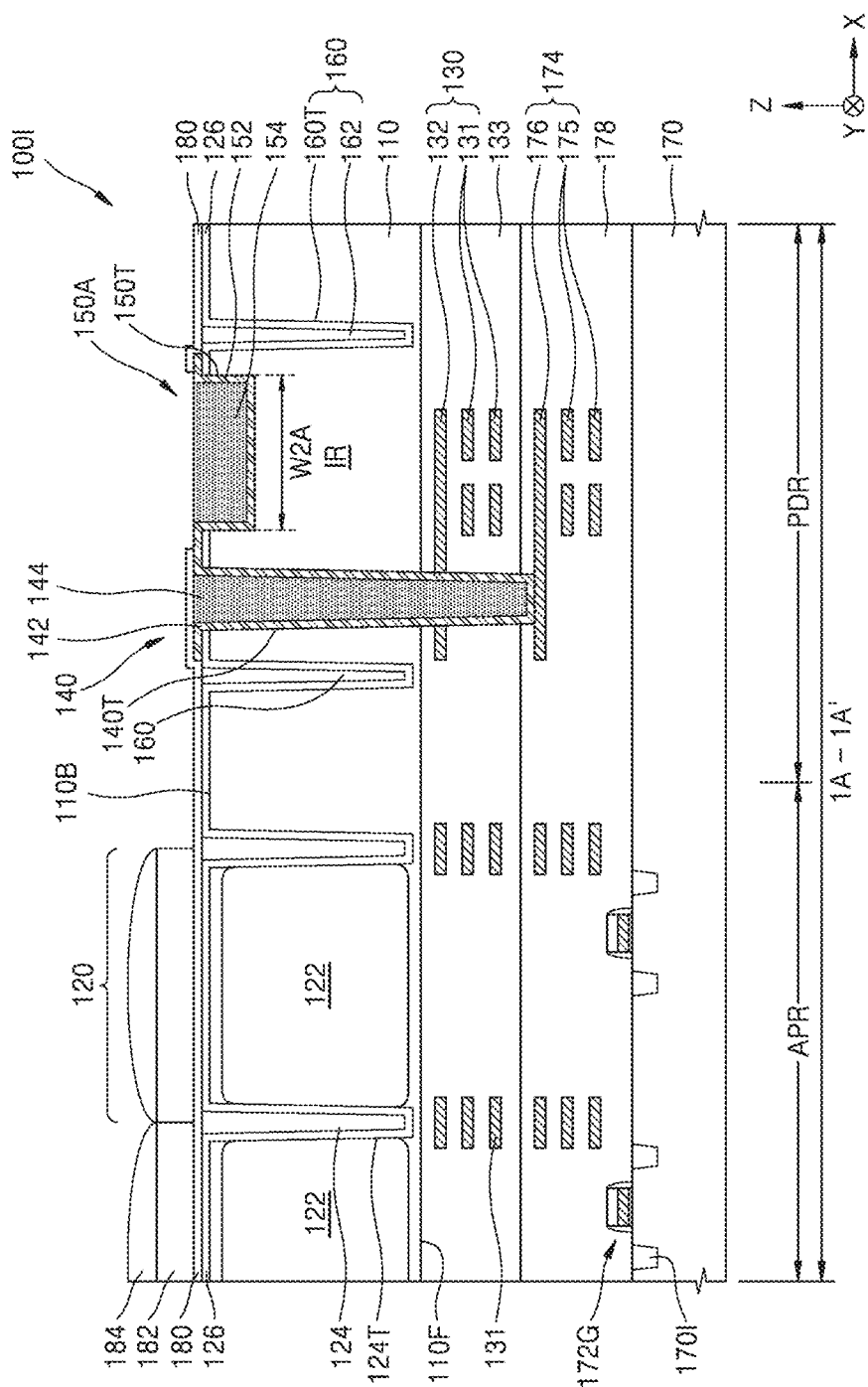
FIG. 12 is a cross-sectional view illustrating an image sensor according to some example embodiments.

FIG. 12 is a cross-sectional view illustrating an image sensor 100I according to some example embodiments. FIG. 12 illustrates a cross-section taken along the line 1A-1A' of FIG. 1. In FIG. 12, the same reference numerals as those of FIGS. 1 to 11 denote the same elements.

Referring to FIG. 12, the image sensor 100I has a stacking structure in which the semiconductor substrate 110 and the lower substrate 170 are attached to each other. The pad insulation layer 156 described with reference to FIG. 11 may not be formed.

FIGS. 13 to 21 are cross-sectional views illustrating a method of manufacturing the image sensor 100H according to some example embodiments. In FIGS. 13 to 21, cross-sections corresponding to the cross-section taken along the line 1A-1A' are illustrated in a process order. In FIGS. 13 to 21, the same reference numerals as those of FIGS. 1 to 12 denote the same reference numerals.

Figure 13:
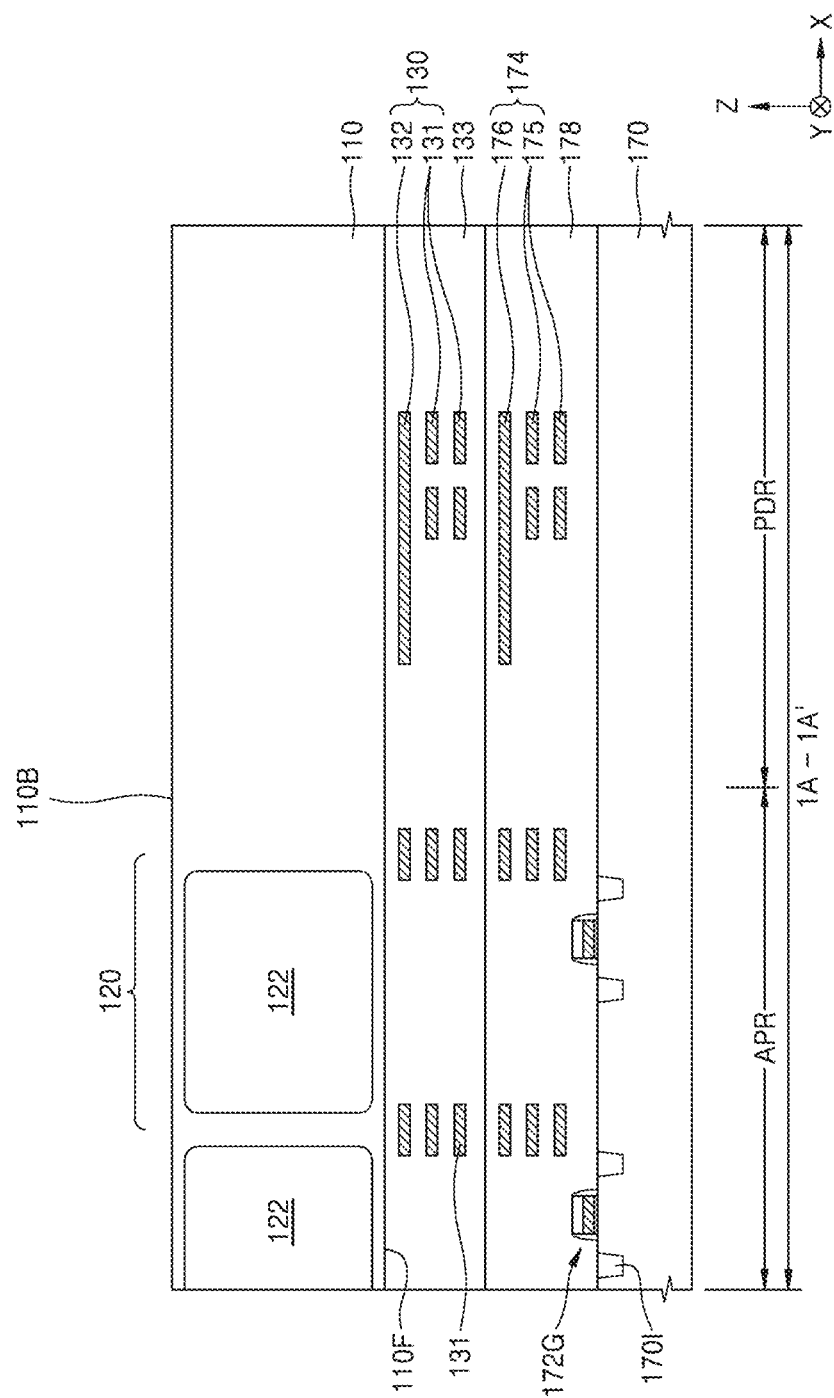
FIGS. 13, 14, 15, 16, 17, 18, 19, 20, and 21 are cross-sectional views illustrating a method of manufacturing an image sensor according to some example embodiments.

Referring to FIG. 13, after forming the isolation layers 1701 that define the active region (not shown) on the lower substrate 170, the gate structures 172G may be formed on the lower substrate 170. Then, the second interconnect structure 174 and the second interlayer insulation layer 178 that covers the second interconnect structure 174 may be formed by forming a conductive layer (not shown) on the lower substrate 170, patterning the conductive layer, and forming an insulation layer (not shown) to cover the patterned conductive layer.

Then, the semiconductor substrate 110 that includes the front surface 110F and the rear surface 110B that are opposite to each other is provided.

The photoelectric conversion regions 120 and a well region (not shown) may be formed by implanting ions from the front surface 110F of the semiconductor substrate 110. For example, the photoelectric conversion regions 120 may be formed by doping n-type impurities and the well region may be formed by doping p-type impurities.

Then, the first interconnect structure 130 and the first interlayer insulation layer 133 that covers the first interconnect structure 130 may be formed on the semiconductor substrate 110 by forming a conductive layer (not shown) on the front surface 110F of the semiconductor substrate 110, patterning the conductive layer, and forming an insulation layer (not shown) to cover the patterned conductive layer.

Then, the lower substrate 170 may be attached to the semiconductor substrate 110. For example, the lower substrate 170 may be attached to the semiconductor substrate 110 so that the first interlayer insulation layer 133 directly contacts the second interlayer insulation layer 178 by an oxide-oxide direct bonding method.

Figure 14:
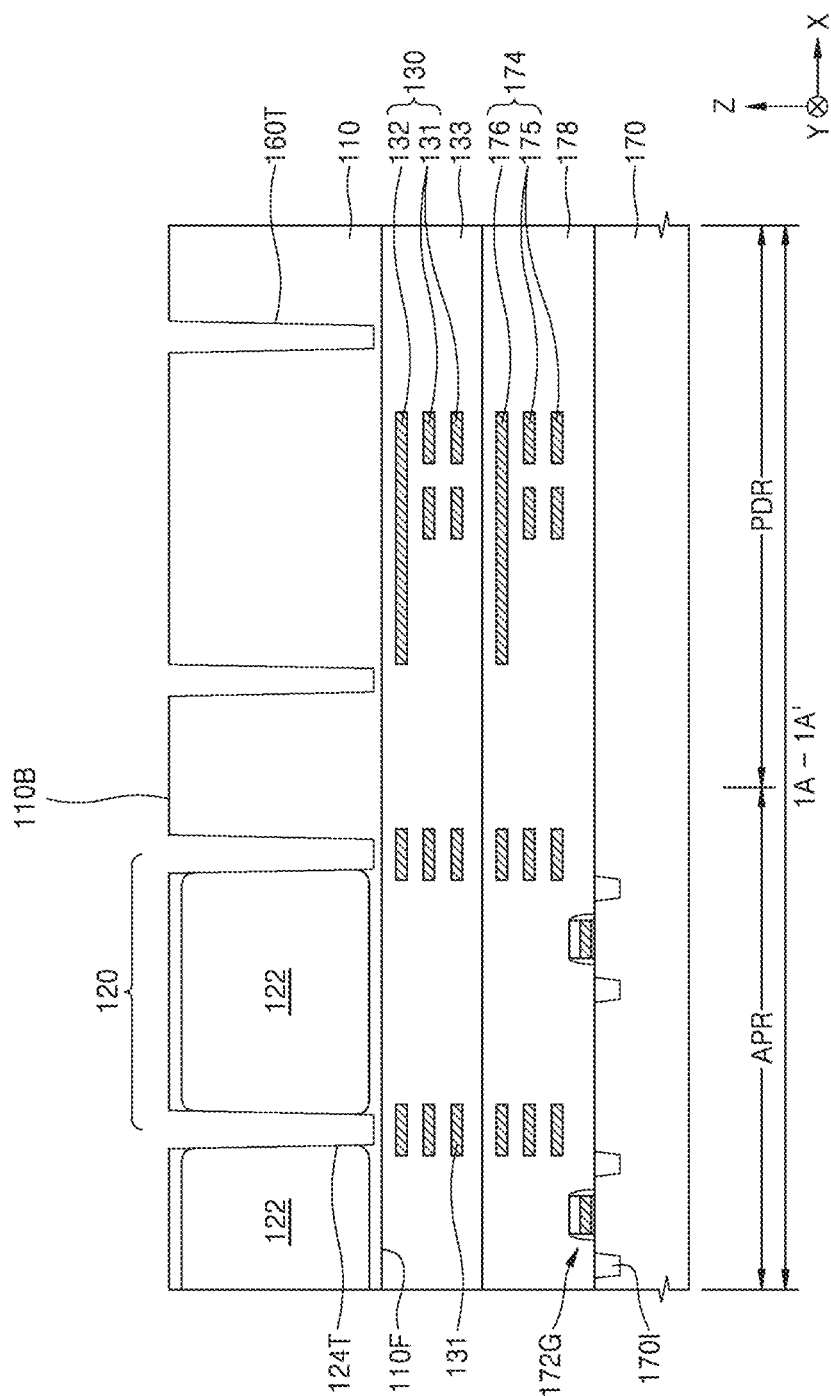

Referring to FIG. 14, the pixel isolation trench 124T and the isolation trench 160T may be formed by forming a first mask pattern (not shown) on the rear surface 110B of the semiconductor substrate 110 and etching the semiconductor substrate 110 from the rear surface 110B by using the mask pattern as an etching mask.

According to some example embodiments, the pixel isolation trench 124T and the isolation trench 160T may be formed not to completely pass through the semiconductor substrate 110 such that the semiconductor substrate 110 is exposed at a bottom of the pixel isolation trench 124T and a bottom of the isolation trench 160T.

According to some example embodiments, the pixel isolation trench 124T and the isolation trench 160T may be formed to completely pass through the semiconductor substrate 110. The first interlayer insulation layer 133 may be exposed by the bottom of the pixel isolation trench 124T and the bottom of the isolation trench 160T.

According to some example embodiments, the pixel isolation region 124A and the isolation structure 160A that are illustrated in FIG. 8 may be formed by forming the pixel isolation trench 124T and the isolation trench 160T not to completely pass through the semiconductor substrate 110 and performing an ion implantation process on the semiconductor substrate 110 exposed by the bottom of the pixel isolation trench 124T and the bottom of the isolation trench 160T.

According to some example embodiments, after forming the pixel isolation trench 124T, the isolation trench 160T may be formed.

Figure 15:
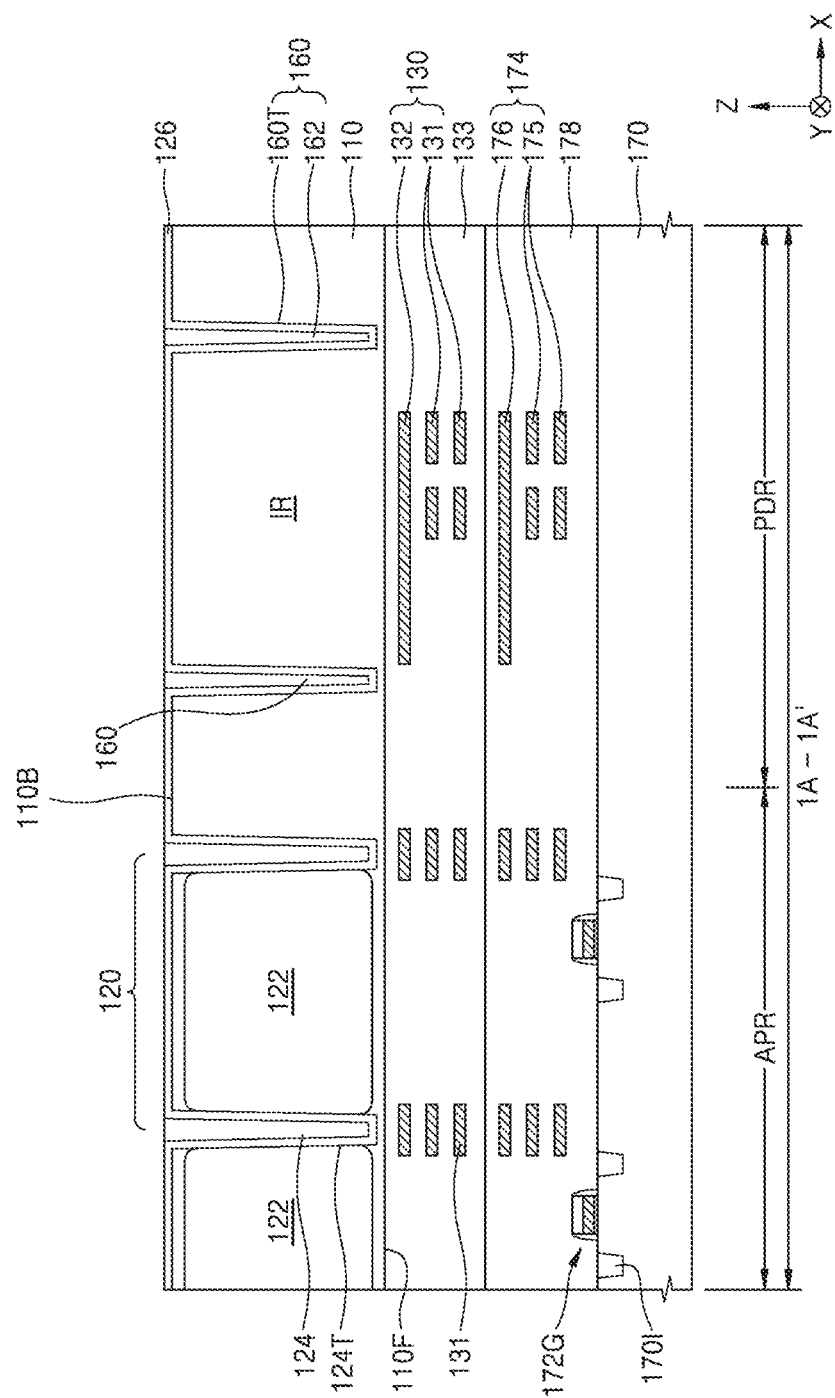

Referring to FIG. 15, the backside insulation layer 126 may be formed on the rear surface 110B of the semiconductor substrate 110 and on internal walls of the pixel isolation trench 124T and the isolation trench 160T by using an insulation material by a chemical vapor deposition (CVD) process and an atomic layer deposition (ALD) process.

The pixel isolation regions 124 and the isolation insulation layer 162 may be formed in the pixel isolation trench 124T and the isolation trench 160T by forming an insulation layer (not shown) that fills the pixel isolation trench 124T and the isolation trench 160T on the rear surface 110B of the semiconductor substrate 110 and planarizing an upper portion of the insulation layer until an upper surface of the backside insulation layer 126 is exposed. Here, the isolation region IR may be defined in a portion of the semiconductor substrate 110 surrounded by the isolation insulation layer 162.

Figure 16:
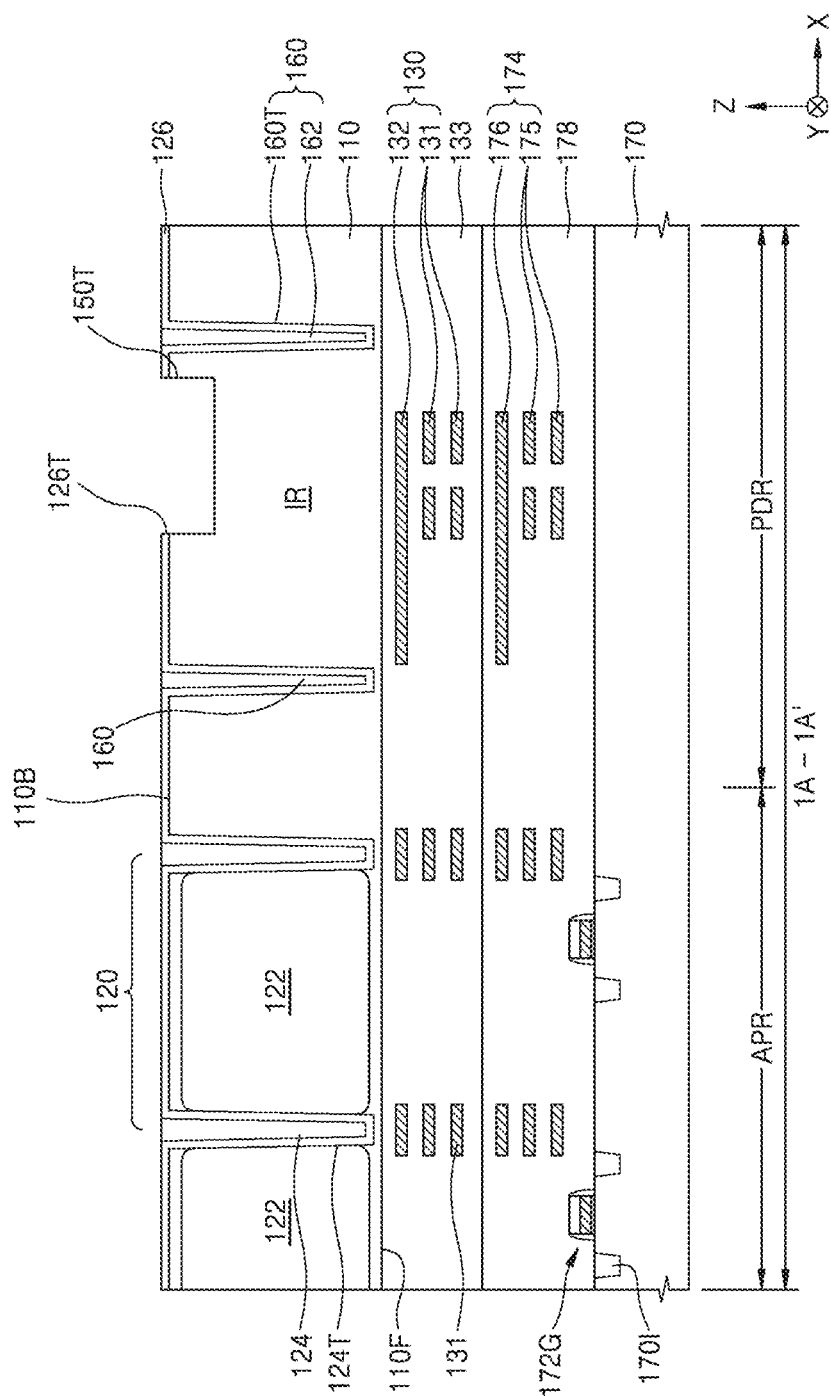

Referring to FIG. 16, the pad trench 150T may be formed by forming a second mask pattern (not shown) on the backside insulation layer 126 and etching the backside insulation layer 126 and the semiconductor substrate 110 by using the second mask pattern as an etching mask. The side wall 126T of the backside insulation layer 126 may be exposed by the pad trench 150T.

Figure 17:
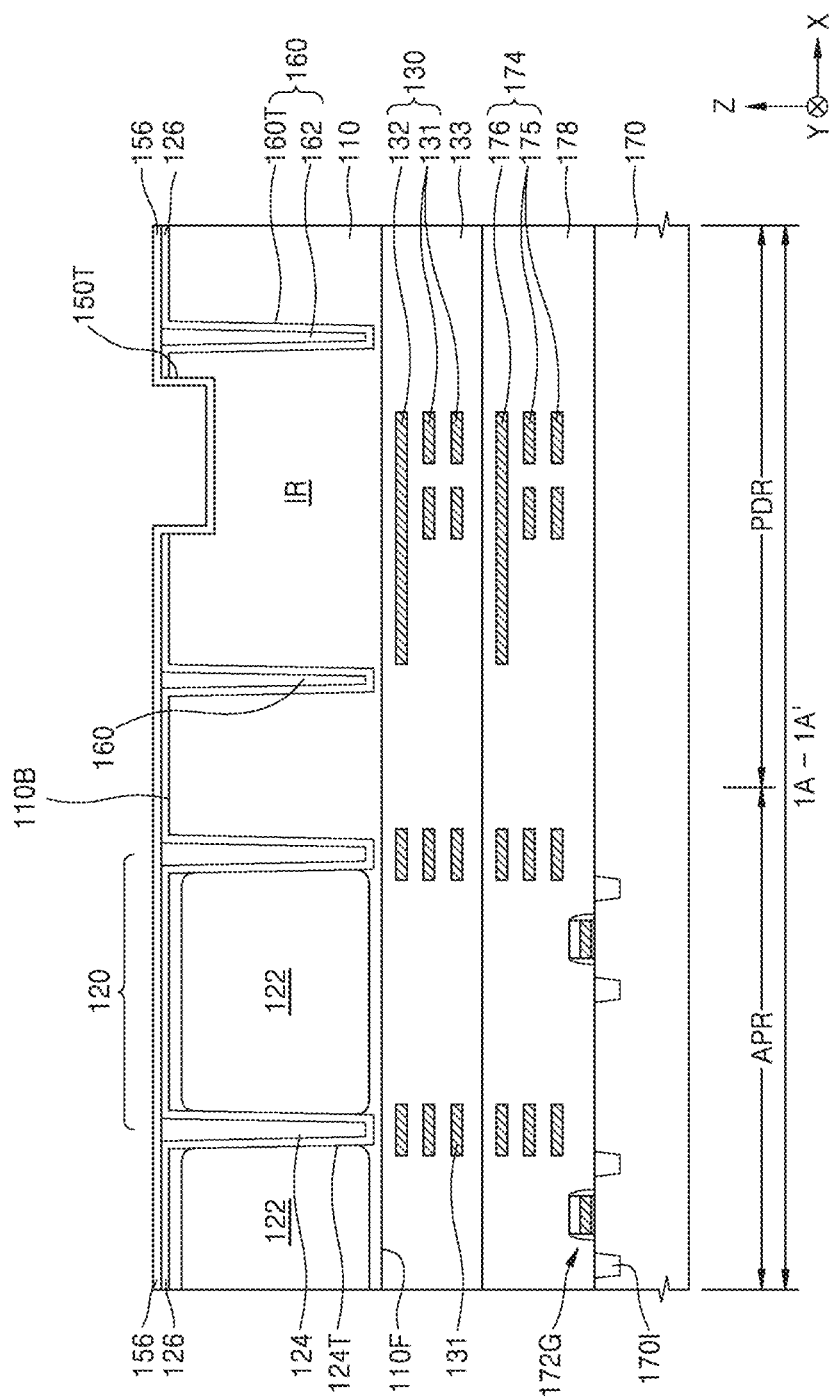

Referring to FIG. 17, the pad insulation layer 156 may be formed on internal walls of the backside insulation layer 126 and the pad trench 150T. For example, the pad insulation layer 156 may be formed of an insulation material by the CVD process and the ALD process.

As the pad trench 150T forms the isolation region IR, the pad insulation layer 156 may have a relatively small thickness. The pad insulation layer 156 may have a first thickness of about several A to about several hundred nm. In general, since the pad insulation layer 156 includes an insulation material, the pad insulation layer 156 may operates as a reflection preventing layer. As the thickness of the pad insulation layer 156 is larger, since an amount light incident on a pixel region is reduced, sensitivity of the image sensor may deteriorate. However, according to the embodiments, since the pad insulation layer 156 is formed in the isolation region IR, the pad insulation layer may have a relatively small thickness. Therefore, it may prevent sensitivity of the image sensor from deteriorating.

Unlike in FIG. 17, the pad insulation layer 156 may not be formed. In this case, the image sensor 100A described with reference to FIG. 3 may be formed. As described above, the pad trench 150T may be formed in the isolation region IR and the pad structure 150 (refer to FIG. 2A) arranged in the pad trench 150T may be electrically insulated from a region outside the isolation region IR. Therefore, the pad insulation layer 156 may be omitted so that it may prevent sensitivity of the image sensor from deteriorating.

Figure 18:
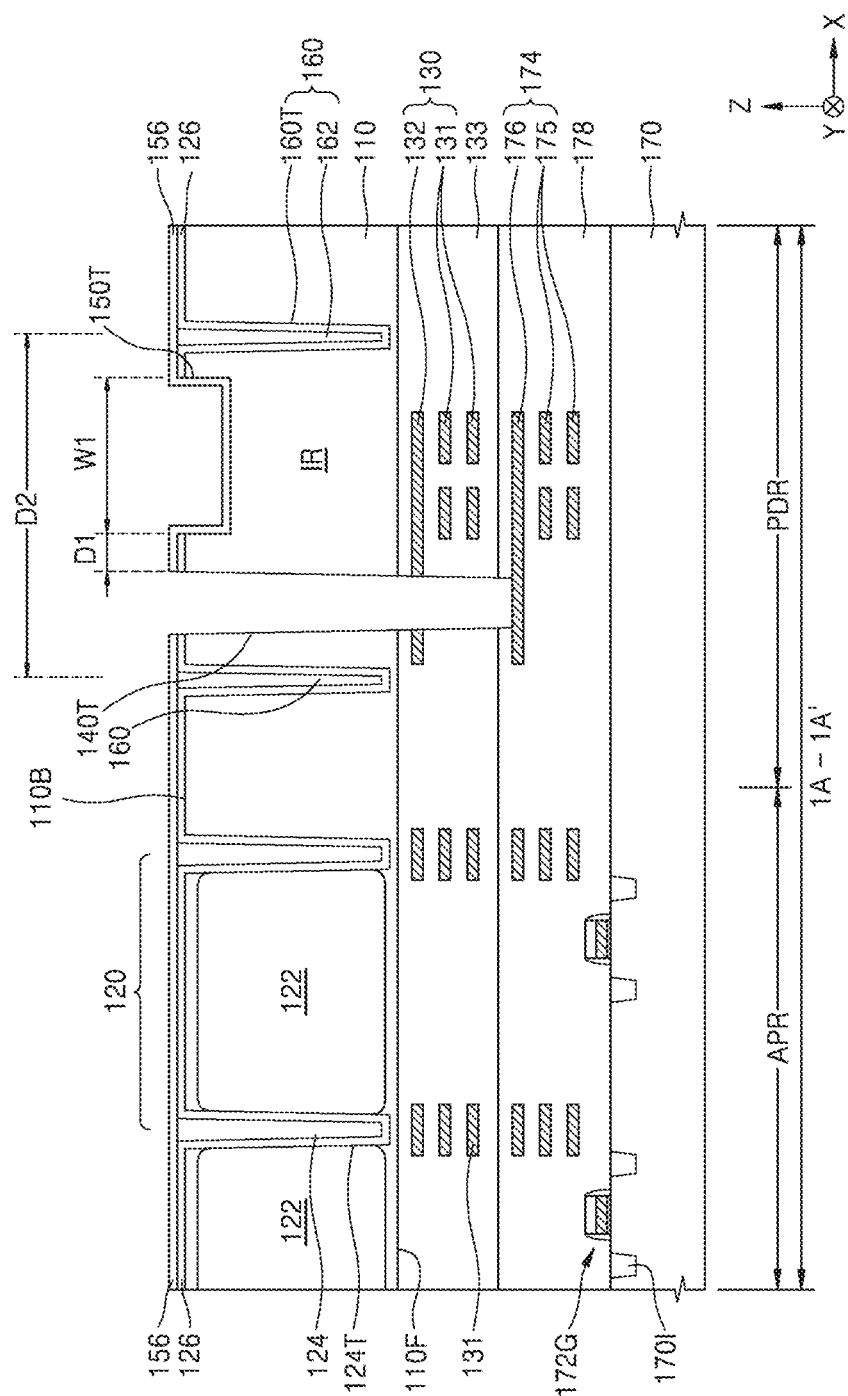

Referring to FIG. 18, the through via trench 140T may be formed by forming a third mask pattern (not shown) on the pad insulation layer 156 and by sequentially etching the pad insulation layer 156, the backside insulation layer 126, the semiconductor substrate 110, the first interlayer insulation layer 133, and the second interlayer insulation layer 178 by using the third mask pattern as an etching mask.

The through via trench 140T may be arranged in the isolation region IR to be separate from the pad trench 150T by a first distance. The through via trench 140T is separate from the pad trench 150T by a first distance D1, which is relatively small. Therefore, a width D2 of the isolation region IR may be small. That is, since the isolation structure 160 is not between the through via trench 140T and the pad trench 150T, the distance D1 from the through via trench 140T to the pad trench 150T and/or the width D2 of the isolation region IR may be small. Therefore, the pad region PDR may be small.

Figure 19:
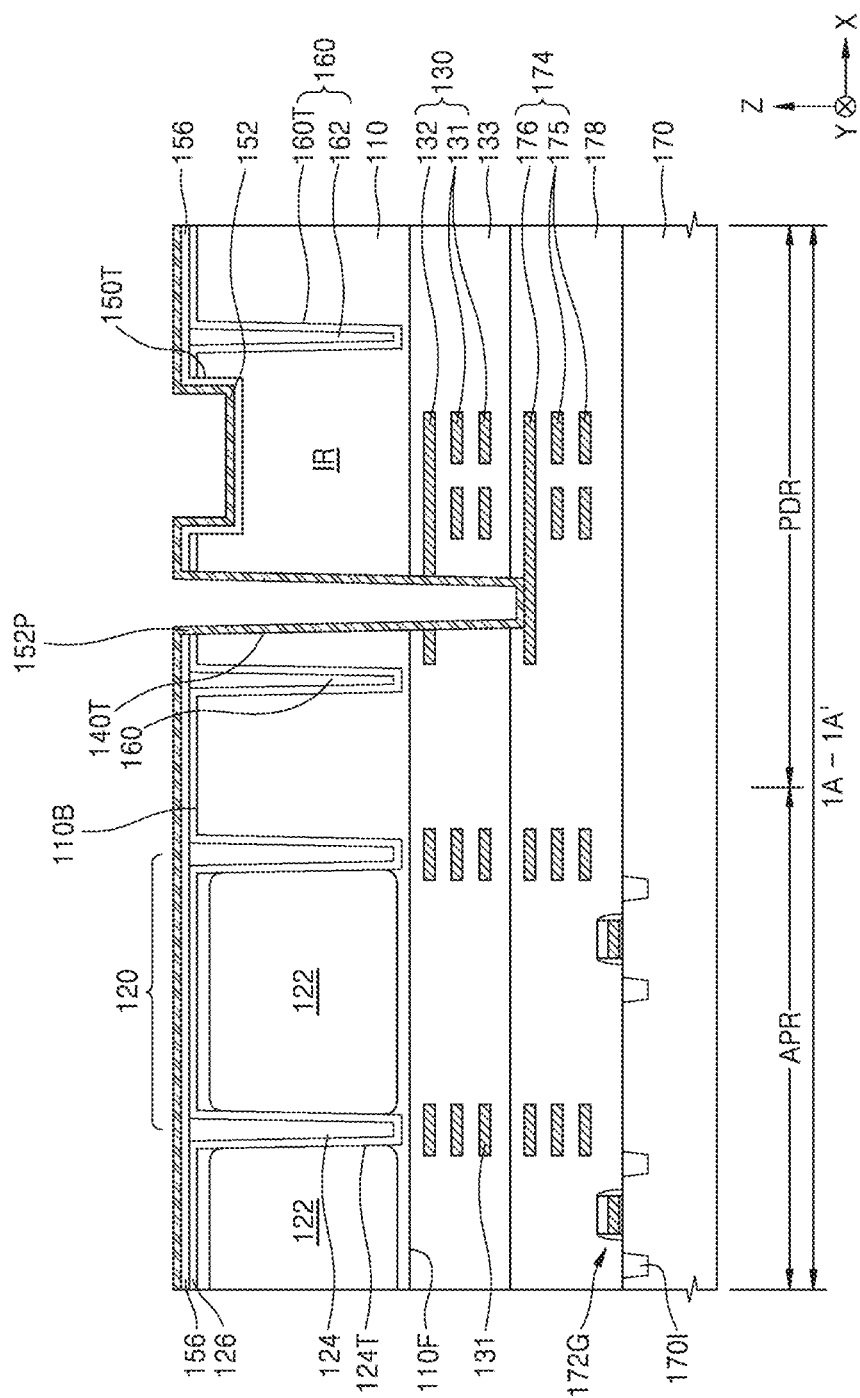

Referring to FIG. 19, a first conductive layer 152P may be conformally formed on the pad insulation layer 156 and on internal walls of the through via trench 140T and the pad trench 150T. The first conductive layer 152P may be formed of a metal such as Ti, TiN, Ta, TaN, TiW, W, Al, Co, Ni, or Cu by the CVD process and the ALD process. The first conductive layer 152P may be electrically connected to the second interconnect structure 174 on the bottom of the through via trench 140T.

Figure 20:
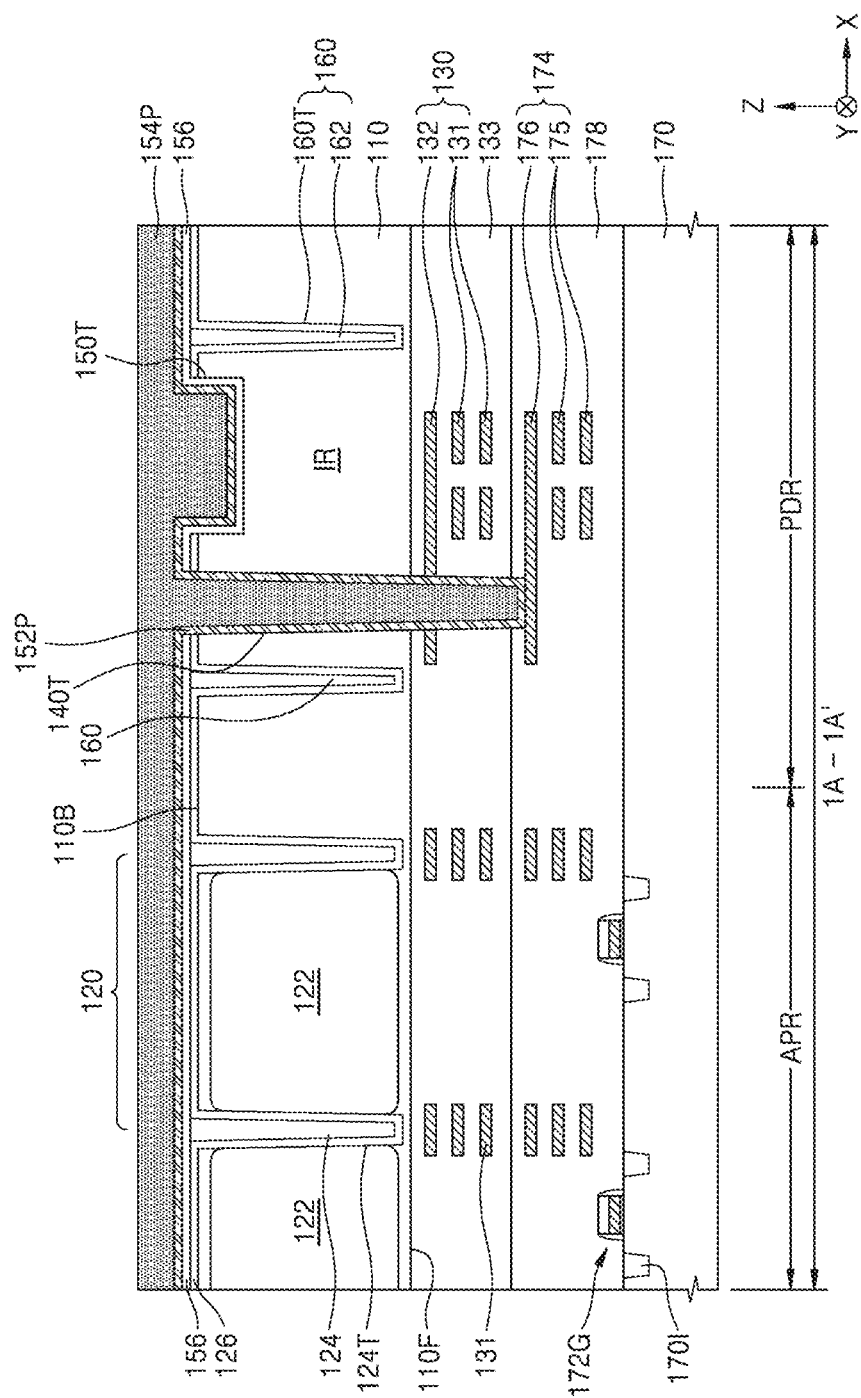

Referring to FIG. 20, a second conductive layer 154P may be formed on the first conductive layer 152P to a thickness sufficient to fill a residual portion of the through via trench 140T and the residual portion of the pad trench 150T. The second conductive layer 154P may be formed of a metal such as W, Al, Co, Ni, or Cu by using the CVD process, the ALD process, or a plating process.

According to some example embodiments, the second conductive layer 154P may completely fill the through via trench 140T. According to some example embodiments, the second conductive layer 154P may fill only an upper entrance of the through via trench 140T.

Figure 21:
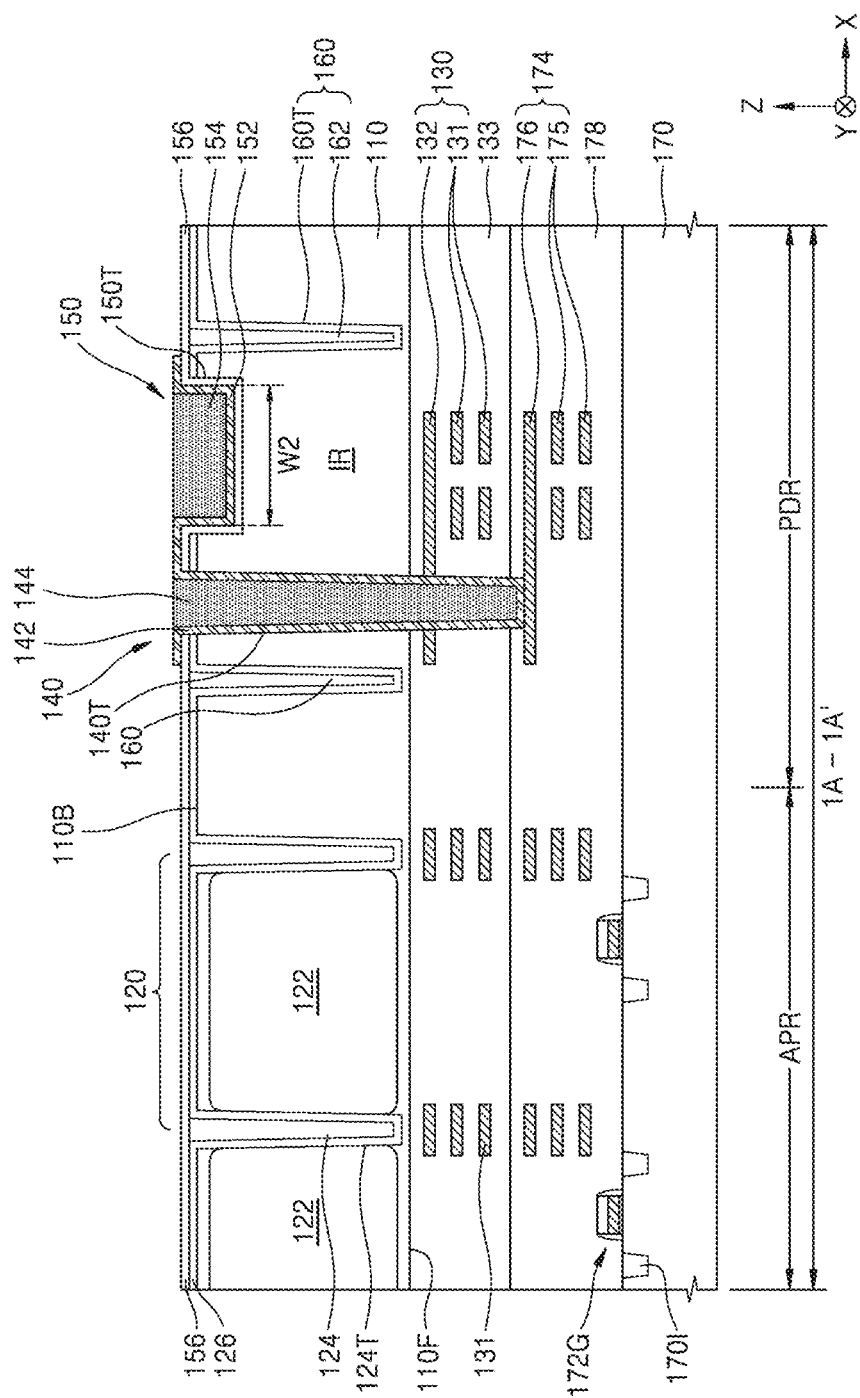

Referring to FIG. 21, the second pad conductive layer may be left in the pad trench 150T and the second via conductive layer 144 may be left in the through via trench 140T by removing an upper portion of the second conductive layer 154P by a planarization process until an upper surface of the first conductive layer 152P (refer to FIG. 20) is exposed.

The first via conductive layer 142 and the first pad conductive layer 152 may be left by forming a fourth mask pattern (not shown) on the exposed upper surface of the first conductive layer 152P and patterning the first conductive layer 152P by using the fourth mask pattern as an etching mask. The first via conductive layer 142 may extend onto the upper surface of the pad insulation layer 156 while surrounding a side wall and bottom surface of the second via conductive layer 144. The first pad conductive layer 152 may extend onto the pad insulation layer 156 while surround a side wall and a bottom surface of the second pad conductive layer 154. The first pad conductive layer is connected to the first via conductive layer 142 on the pad insulation layer 156 so that the through via structure 140 and the pad structure 150 electrically connected to the through via structure 140 may be formed.

The pad structure 150 may have a second width W2 in a first direction (an X direction) and the pad insulation layer 156 is formed to a small thickness so that the second width W2 of the pad structure 150 may be large.

Referring to FIG. 11 again, the upper surface of the pad structure 150 may be exposed by forming the passivation layer 180 on the rear surface 110B of the semiconductor substrate 110 and patterning the passivation layer 180.

Then, the color filter 182 and the micro-lens 184 may be formed on the passivation layer.

The pad structure 150 has the upper surface at the same level as the upper surface of the through via structure 140 and a difference in level between the upper surface of the pixel region APR and the upper layer of the pad region PDR may be negligible. Therefore, it may prevent a patterning defect from being generated in a coating layer patterning process for forming the color filter 182 and the micro-lens 184.

The image sensor 100H may be completed by the above process.

Figure 22:
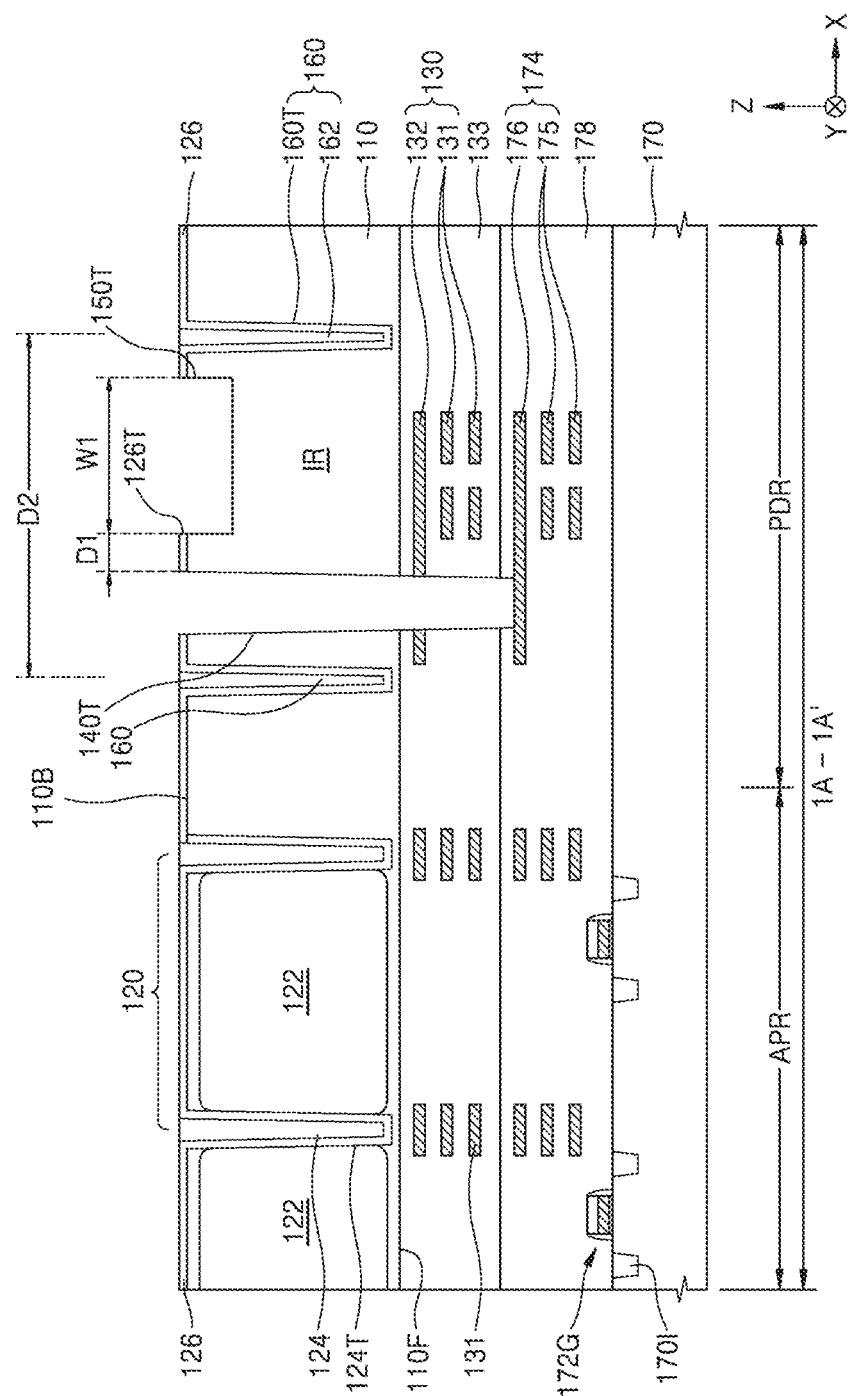
FIGS. 22 and 23 are cross-sectional views illustrating a method of manufacturing an image sensor according to some example embodiments.
Figure 23:
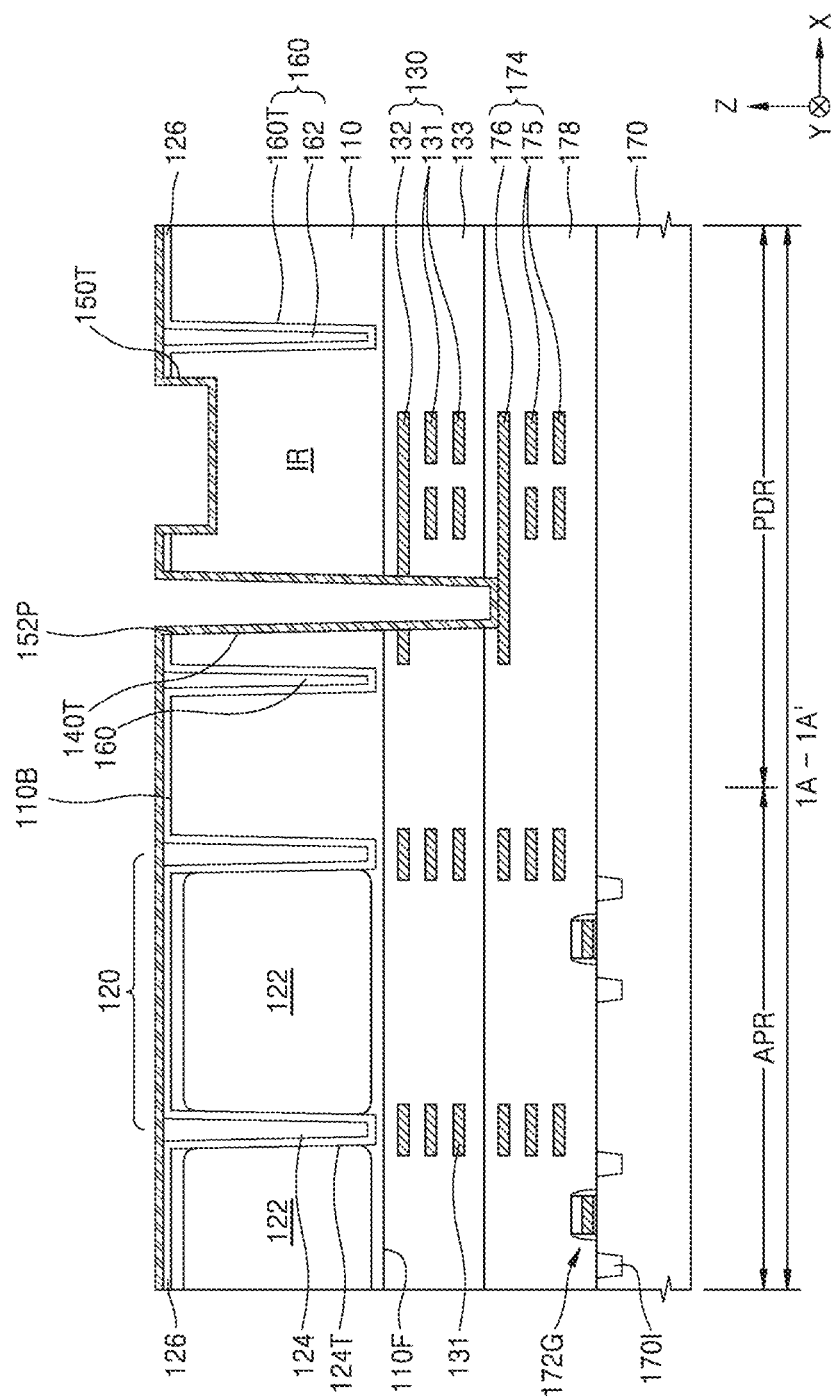

FIGS. 22 and 23 are cross-sectional views illustrating a method of manufacturing the image sensor 100I according to some example embodiments. In FIGS. 22 to 23, cross-sections corresponding to the cross-section taken along the line 1A-1A' are illustrated in a process order. In FIGS. 22 to 23, the same reference numerals as those of FIGS. 1 to 21 denote the same reference numerals.

The pixel isolation region 124A and the isolation structure 160A may be formed in the semiconductor substrate 110 by performing the processes described with reference to FIGS. 13 to 15.

Referring to FIG. 22, the through via trench 140T and the pad trench 150T may be formed by forming the second mask pattern (not shown) on the backside insulation layer 126 and etching the backside insulation layer 126 and the semiconductor substrate 110 by using the second mask pattern as an etching mask. In a process of forming the through via trench 140T and the pad trench 150T, a side wall 126T of the backside insulation layer 126 may be exposed by the pad trench 150T.

According to some example embodiments, the through via trench 140T and the pad trench 150T may be formed in the same process. However, the inventive concepts are not limited thereto. According to some example embodiments, after forming the through via trench 140T, the pad trench 150T may be formed.

Referring to FIG. 23, the first conductive layer 152P may be conformally formed on the backside insulation layer 126 and on the internal walls of the through via trench 140T and the pad trench 150T. The first conductive layer 152P may be electrically connected to the second interconnect structure 174 on the bottom of the through via trench 140T.

Referring to FIG. 23, the second pad conductive layer 154 may be left in the pad trench 150T and the second via conductive layer 144 may be left in the through via trench 140T by forming the second conductive layer 154P (refer to FIG. 20) on the first conductive layer 152P (refer to FIG. 22) to have a thickness sufficient to fill the residual portion of the through via trench 140T and the residual portion of the pad trench 150P, and removing an upper portion of the second conductive layer 154P by a planarization process until an upper surface of the first conductive layer 152P is exposed.

The pad structure 150A may be formed to have a second width W2A in the first direction (the X direction). Unlike in FIG. 20, since the pad insulation layer 156 is not formed, the second width W2A of the pad structure 150A may be relatively large.

Then, the image sensor 100I may be completed by performing the process described with reference to FIG. 21.

According to the method of manufacturing the image sensor 100I, since the pad trench 150T and the through via trench 140T may be simultaneously formed, the image sensor 100I may be formed by simplified processes.

An image sensor as described herein may be included in an electronic device. As described herein, the electronic device may be for example any electronic device having a structure including an electrode, an active layer, and an encapsulation film. For example, the electronic device may be a photoelectric device, an organic light emitting diode, a solar cell, a photosensor, and the like, but is not limited thereto.

The electronic device may be various electronic apparatuses, for example a mobile phone, a digital camera, a solar cell, an organic light emitting diode (OLED) display, and the like, but is not limited thereto.

Figure 24:
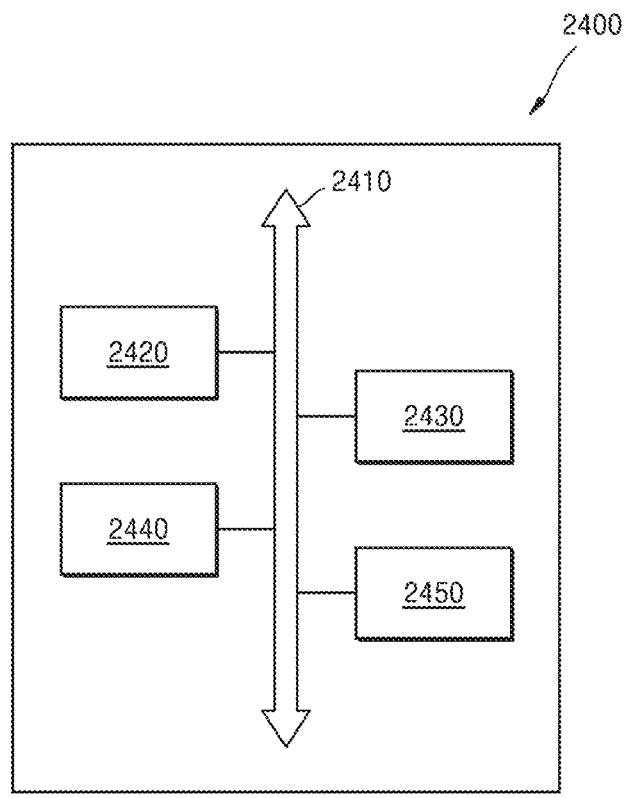
FIG. 24 is a diagram illustrating an electronic device according to some example embodiments.

FIG. 24 is a diagram illustrating an electronic device 2400 according to some example embodiments.

Referring to FIG. 24, the electronic device 2400 includes a memory 2420, a processor 2430, a device 2440, and a communication interface 2450. The device 2440 may include any of the electronic devices illustrated and described herein.

The electronic device 2400 may be included in one or more various electronic devices, including, for example, a mobile phone, a digital camera, a sensor device, a biosensor device, and the like. In some example embodiments, the electronic device 2400 may include one or more of an image providing server, a mobile device, a computing device, an image outputting device, and an image capturing device. A mobile device may include a mobile phone, a smartphone, a personal digital assistant (PDA), some combination thereof, or the like. A computing device may include a personal computer (PC), a tablet computer, a laptop computer, a netbook, some combination thereof, or the like. An image outputting device may include a TV, a smart TV, some combination thereof, or the like. An image capturing device may include a camera, a camcorder, some combination thereof, or the like.

The memory 2420, the processor 2430, the device 2440, and the communication interface 2450 may communicate with one another through a bus 2410.

The communication interface 2450 may communicate data from an external device using various Internet protocols. The external device may include, for example, an image providing server, a display device, a mobile device such as, a mobile phone, a smartphone, a personal digital assistant (PDA), a tablet computer, and a laptop computer, a computing device such as a personal computer (PC), a tablet PC, and a netbook, an image outputting device such as a TV and a smart TV, and an image capturing device such as a camera and a camcorder.

The processor 2430 may execute a program and control the electronic device 2400. A program code to be executed by the processor 2430 may be stored in the memory 2420. An electronic system may be connected to an external device through an input/output device (not shown) and exchange data with the external device.

The memory 2420 may store information. The memory 2420 may be a volatile or a nonvolatile memory. The memory 2420 may be a non-transitory computer readable storage medium. The memory may store computer-readable instructions that, when executed, cause the execution of one or more methods, functions, processes, etc. as described herein. In some example embodiments, the processor 2430 may execute one or more of the computer-readable instructions stored at the memory 2420.

In some example embodiments, the communication interface 2450 may include a USB and/or HDMI interface. In some example embodiments, the communication interface 2450 may include a wireless communication interface.

Figure 25:
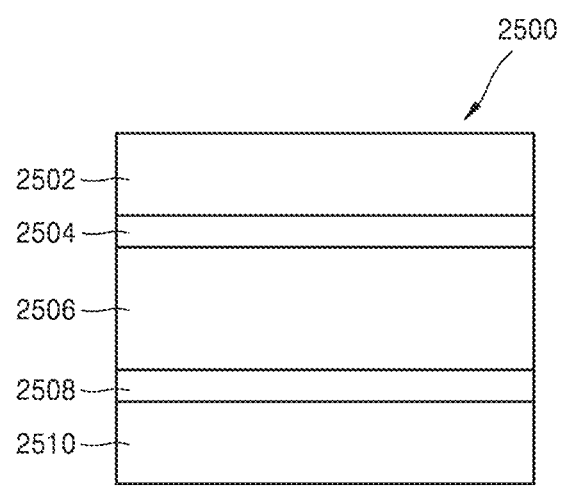
FIG. 25 is a cross-sectional view showing a solar cell according to some example embodiments.

FIG. 25 is a cross-sectional view showing a solar cell 2500 according to some example embodiments. Referring to FIG. 25, a solar cell 2500 includes a first electrode 2502 and a second electrode 2510, and a photoactive layer 2506 positioned between the first electrode 2502 and the second electrode 2510.

A substrate (not shown) may be positioned at the first electrode 2502 or the second electrode 2510, and may include a light-transmitting material. The light-transmitting material may include, for example, an inorganic material (e.g., glass), or an organic material (e.g., polycarbonate, polymethylmethacrylate, polyethylene terephthalate, polyethylene naphthalate, polyamide, polyethersulfone, or a combination thereof).

One of the first electrode 2502 and the second electrode 2510 is an anode and the other is a cathode. At least one of the first electrode 2502 and second electrode 2510 may be a light-transmitting electrode, and light may enter toward the light-transmitting electrode. The light-transmitting electrode may be made of, for example, a conductive oxide (e.g., indium tin oxide (ITO)), indium doped zinc oxide (IZO), tin oxide (SnO2), aluminum-doped zinc oxide (AZO), and/or gallium-doped zinc oxide (GZO), or a transparent conductor of a conductive carbon composite (e.g., carbon nanotubes (CNT) or graphenes). At least one of the first electrode 2502 and the second electrode 2510 may be an opaque electrode, which may be made of an opaque conductor, for example, aluminum (Al), silver (Ag), gold (Au), and/or lithium (Li).

The photoactive layer 2506 may include an electronic device according to some example embodiments as described herein.

First and second auxiliary layers 2504 and 2508 may be positioned between the first electrode 2502 and the photoactive layer 2506 and between the second electrode 2510 and the photoactive layer 2506, respectively. The first and second auxiliary layers 2504 and 2508 may increase charge mobility between the first electrode 2502 and the photoactive layer 2506 and between the second electrode 2510 and the photoactive layer 2506. The first and second auxiliary layers 2504 and 2506 may be at least one selected from, for example, an electron injection layer (EIL), an electron transport layer, a hole injection layer (HIL), a hole transport layer, and a hole blocking layer, but are not limited thereto. One or both of the first and second auxiliary layers 2504 and 2508 may be omitted.

The photoactive layer 2506 may have a tandem structure where at least two thereof are stacked.

Figure 26:
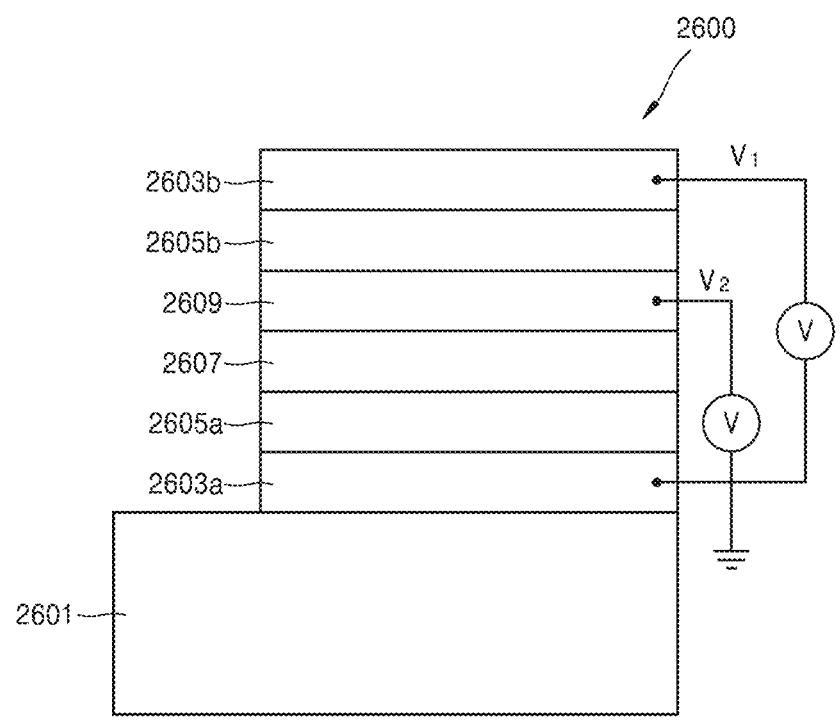
FIG. 26 is a sectional view of an organic light-emitting display apparatus according to some example embodiments.

FIG. 26 is a sectional view of an organic light-emitting display apparatus 2600 according to some example embodiments.

Referring to FIG. 26, a first electrode 2603*a* and a second electrode 2603*b* are positioned on a substrate 2601, a first emission layer 2605*a* is positioned on the first electrode 2603*a*, and a second emission layer 2605*b* is positioned under the second electrode 2603*b*.

The substrate 2601 may include a material selected from the group consisting of glass, quartz, silicon, a synthetic resin, a metal, and a combination thereof. The synthetic resin may include polyethylene naphthalate (PEN), polyethylene terephthalate (PET), polycarbonate, polyvinyl alcohol, polyacrylate, polyimide, polynorbornene and/or polyethersulfone (PES), etc. The metal plate may include a stainless steel foil and/or an aluminum foil, etc.

The first electrode 2603*a* may include a material having a work function of about 4.3 eV to about 5.0 eV, about 4.3 eV to about 4.7 eV, or about 4.3 eV to about 4.5 eV. According to example embodiments, the material may include aluminum (Al), copper (Cu), magnesium (Mg), molybdenum (Mo) and/or an alloy thereof, etc. In addition, these metals may be laminated to provide a first electrode. The first electrode 2603*a* may have a thickness of about 260 to about 260 nm.

The second electrode 2603*b* may include a material having a work function of about 26.3 eV to about 26.7 eV or about 26.5 eV to about 26.7 eV. According to some example embodiments, the second electrode 2603*b* may include Ba:Al. The second electrode 2603*b* may have a thickness of about 260 to about 260 nm.

The first emission layer 2605*a* and the second emission layer 2605*b* may include an electronic device according to some example embodiments as described herein.

A middle electrode 2609 is positioned between the first emission layer 2605*a* and the second emission layer 2605*b*. The middle electrode 2609 may include a material having a work function of about 5.0 eV to about 5.2 eV. According to some example embodiments, the material may include a conductive polymer. The conductive polymer may include polythiophene, polyaniline, polypyrrole, polyacene, polyphenylene, polyphenylenevinylene, a derivative thereof, a copolymer thereof, or a mixture thereof.

A buffer layer 2607 may be positioned between the first emission layer 2605*a* and the middle electrode 2609, and may include a material selected from the group consisting of a metal oxide, a polyelectrolyte, and combinations thereof. The combination thereof refers to the metal oxide and polyelectrolyte being mixed or laminated to provide a multilayer. In addition, the different kinds of metal oxide or polyelectrolyte may be laminated.

Figure 27:
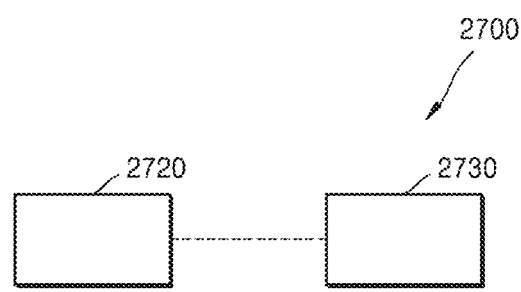
FIG. 27 is a view showing a sensor according to some example embodiments.

FIG. 27 is a view showing a sensor 2700 according to some example embodiments.

Referring to FIG. 27, a sensor 2700 (for example a gas sensor, light sensor, energy sensor, but example embodiments are not limited thereto) includes at least one electrode 2720 configured to output a signal to a processor 2730. The processor 2730 may include a microprocessor, but example embodiments are not limited thereto. The electrode 2720 may include an electronic device according to some example embodiments as described herein.

While the inventive concepts has been particularly shown and described with reference to embodiments thereof, it will be understood that various changes in form and details may be made therein without departing from the spirit and scope of the following claims.

What is claimed is:

1. An image sensor comprising:
 a semiconductor substrate including a pixel region and a pad region;
 a plurality of photoelectric conversion regions in the pixel region;
 an interconnect structure on a front surface of the semiconductor substrate;
 a pad structure in the pad region, the pad structure on a rear surface of the semiconductor substrate;
 at least two through via structures in the pad region, each of the at least two through via structures electrically connected to the interconnect structure through the semiconductor substrate; and
 an isolation structure at least partially extending into the semiconductor substrate and through the pad region of the semiconductor substrate from the rear surface of the semiconductor substrate, in a direction extending perpendicular to the rear surface of the semiconductor substrate, the isolation structure surrounding all of the pad structure and all of the at least two through via structures in a plane extending parallel to the rear surface of the semiconductor substrate.

2. The image sensor of claim 1, wherein
 the isolation structure at least partially defines an isolation region in the semiconductor substrate, and
 the isolation region and the pad structure overlap each other in the direction extending perpendicular to the rear surface of the semiconductor substrate.

3. The image sensor of claim 1, wherein
 the isolation structure is not between the pad structure and the at least two through via structures within the semiconductor substrate, and
 the isolation structure is not between two adjacent through via structures of the at least two through via structures within the semiconductor substrate.

4. The image sensor of claim 1, wherein the pad structure comprises:
 a pad insulation layer extending conformally on an internal wall of a pad trench extending into the semiconductor substrate from the rear surface of the semiconductor substrate; and a pad conductive layer on the pad insulation layer, the pad conductive layer filling the pad trench.

5. The image sensor of claim 4, wherein
the at least two through via structures are spaced apart from the pad structure in a direction parallel with the rear surface of the semiconductor substrate,
each of the at least two through via structures includes a via conductive layer on an internal wall of a through via trench, the through via trench extending through the semiconductor substrate, the via conductive layer isolated from direct contact with the pad trench, and
a portion of the pad conductive layer extends onto the rear surface of the semiconductor substrate and is connected to the via conductive layer.

6. The image sensor of claim 4, wherein
the at least two through via structures overlap the pad structure in the direction extending perpendicular to the rear surface of the semiconductor substrate, and
each of the at least two through via structures includes a via conductive layer on an internal wall of a through via trench, the via conductive layer connected to the pad trench, the via conductive layer connected to the pad conductive layer.

7. The image sensor of claim 1, further comprising:
a pixel isolation region between two adjacent ones of the plurality of photoelectric conversion regions, the pixel isolation region being on an internal wall of a pixel isolation trench,
wherein the pixel isolation trench extends into the semiconductor substrate from the rear surface of the semiconductor substrate toward the front surface of the semiconductor substrate, and
the pixel isolation trench does not completely penetrate the semiconductor substrate.

8. The image sensor of claim 7, wherein
the isolation structure has a sidewall inclined at a first angle with respect to the rear surface of the semiconductor substrate,
the pixel isolation region has a sidewall inclined at a second angle with respect to the rear surface of the semiconductor substrate, and the second angle is the same as the first angle.

9. The image sensor of claim 1, further comprising:
a pixel isolation region between two adjacent ones of the plurality of photoelectric conversion regions, the pixel isolation region being on an internal wall of a pixel isolation trench,
wherein the pixel isolation trench penetrates the semiconductor substrate from the front surface of the semiconductor substrate toward the rear surface of the semiconductor substrate, and
the pixel isolation region extends in the pixel isolation trench from the front surface of the semiconductor substrate toward the rear surface of the semiconductor substrate.

10. The image sensor of claim 9, wherein the pixel isolation region comprises:
a pixel isolation layer on the internal wall of the pixel isolation trench; and
a pixel isolation conductive layer on the pixel isolation layer, the pixel isolation conductive layer filling the pixel isolation trench.

11. An image sensor comprising:
a semiconductor substrate including a pixel region and a pad region;
a plurality of photoelectric conversion regions in the pixel region;
a pixel isolation region between two adjacent ones of the plurality of photoelectric conversion regions, the pixel isolation region at least partially extending from a rear surface of the semiconductor substrate;
an interconnect structure on a front surface of the semiconductor substrate;
a pad structure in the pad region, the pad structure on the rear surface of the semiconductor substrate;
at least two through via structures in the pad region, each of the at least two through via structures electrically connected to the interconnect structure through the semiconductor substrate; and
an isolation structure at least partially extending into the semiconductor substrate and through the pad region of the semiconductor substrate from the rear surface of the semiconductor substrate, in a direction extending perpendicular to the rear surface of the semiconductor substrate, the isolation structure surrounding the pad structure and the at least two through via structures.

12. The image sensor of claim 11, wherein
the isolation structure is not between the pad structure and the at least two through via structures within the semiconductor substrate, and
the isolation structure is not between two adjacent through via structures of the at least two through via structures within the semiconductor substrate.

13. The image sensor of claim 11, wherein the pad structure comprises:
a pad insulation layer extending conformally on an internal wall of a pad trench extending into the semiconductor substrate from the rear surface of the semiconductor substrate; and
a pad conductive layer on the pad insulation layer, the pad conductive layer filling the pad trench.

14. The image sensor of claim 13, wherein
the at least two through via structures are spaced apart from the pad structure in a direction parallel with the rear surface of the semiconductor substrate,
each of the at least two through via structures includes a via conductive layer on an internal wall of a through via trench, the through via trench extending through the semiconductor substrate, the via conductive layer isolated from direct contact with the pad trench, and
a portion of the pad conductive layer extends onto the rear surface of the semiconductor substrate and is connected to the via conductive layer.

15. The image sensor of claim 14, further comprising:
a backside insulation layer on the rear surface of the semiconductor substrate,
wherein the portion of the pad conductive layer is on the backside insulation layer.

16. The image sensor of claim 13, wherein
the at least two through via structures overlap the pad structure in the direction extending perpendicular to the rear surface of the semiconductor substrate, and
each of the at least two through via structures includes a via conductive layer on an internal wall of a through via trench, the via conductive layer connected to the pad trench, the via conductive layer connected to the pad conductive layer.

17. The image sensor of claim 11, wherein
the pixel isolation region is on an internal wall of a pixel isolation trench,
the pixel isolation trench extends into the semiconductor substrate from the rear surface of the semiconductor substrate toward the front surface of the semiconductor substrate, and the pixel isolation trench does not completely penetrate the semiconductor substrate.

18. The image sensor of claim 17, wherein
the isolation structure has a sidewall inclined at a first angle with respect to the rear surface of the semiconductor substrate,
the pixel isolation region has a sidewall inclined at a second angle with respect to the rear surface of the semiconductor substrate, and the second angle is the same as the first angle.

19. The image sensor of claim 11, wherein
the pixel isolation region is on an internal wall of a pixel isolation trench, and
the pixel isolation trench penetrates the semiconductor substrate from the front surface of the semiconductor substrate toward the rear surface of the semiconductor substrate.

20. The image sensor of claim 19, wherein the pixel isolation region comprises:
a pixel isolation layer on the internal wall of the pixel isolation trench; and
a pixel isolation conductive layer on the pixel isolation layer, the pixel isolation conductive layer filling the pixel isolation trench.

* * * * *